(12) United States Patent
Tokunaga et al.

(10) Patent No.: US 9,258,503 B2
(45) Date of Patent: Feb. 9, 2016

(54) A/D CONVERTER, IMAGE SENSOR, AND DIGITAL CAMERA

(71) Applicant: Panasonic Intellectual Property Management Co., Ltd., Osaka (JP)

(72) Inventors: Yusuke Tokunaga, Hyogo (JP); Yasuhiro Tatewaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/431,314

(22) PCT Filed: Sep. 17, 2013

(86) PCT No.: PCT/JP2013/005472
§ 371 (c)(1),
(2) Date: Mar. 26, 2015

(87) PCT Pub. No.: WO2014/087561
PCT Pub. Date: Jun. 12, 2014

(65) Prior Publication Data
US 2015/0249801 A1 Sep. 3, 2015

(30) Foreign Application Priority Data

Dec. 6, 2012 (JP) ................. 2012-267368

(51) Int. Cl.
*H03M 1/12* (2006.01)
*H04N 5/3745* (2011.01)
(Continued)

(52) U.S. Cl.
CPC ............. *H04N 5/37455* (2013.01); *H03M 3/35* (2013.01); *H03M 3/458* (2013.01); *H04N 5/357* (2013.01); *H04N 5/3595* (2013.01); *H04N 5/378* (2013.01); *H04N 5/374* (2013.01)

(58) Field of Classification Search
CPC ........ H03M 3/35; H03M 3/458; H04N 5/357; H04N 5/374; H04N 5/3595
USPC .................................................. 341/118–155
See application file for complete search history.

(56) References Cited

U.S. PATENT DOCUMENTS 5,900,767 A * 5/1999 Bird ...................... H04N 5/359
327/407
6,118,830 A * 9/2000 Thies .................. H03M 1/1295
348/E5.071

(Continued)

FOREIGN PATENT DOCUMENTS

| JP | 2004-510381 | 4/2004 |
| JP | 2006-350754 | 12/2006 |

(Continued)

OTHER PUBLICATIONS

International Search Report issued Oct. 29, 2013 in International (PCT) Application No. PCT/JP2013/005472.

(Continued)

*Primary Examiner* — Lam T Mai
(74) *Attorney, Agent, or Firm* — Wenderoth, Lind & Ponack, L.L.P.

(57) ABSTRACT

An A/D converter includes: an A/D converter circuit that causes a dissipation current ($I_{dis}$) having dependence on an input voltage ($V_{in}$); and a counteracting current generation circuit controlled based on an output digital value ($D_{out}$) provided from the A/D converter circuit to generate a counteracting current ($I_{cnt}$) that is a dissipation current for reducing the dependence of the dissipation current ($I_{dis}$) on the input voltage.

20 Claims, 36 Drawing Sheets

(51) Int. Cl.
*H04N 5/378* (2011.01)
*H04N 5/359* (2011.01)
*H03M 3/00* (2006.01)
*H04N 5/357* (2011.01)
*H04N 5/374* (2011.01)

(56) References Cited

U.S. PATENT DOCUMENTS

| | | | |
|---|---|---|---|
| 6,191,411 B1* | 2/2001 | Kaifu | H01L 27/14658 250/214 C |
| 6,501,401 B2 | 12/2002 | Van Den Boom et al. | |
| 6,580,454 B1* | 6/2003 | Perner | H01L 27/14643 257/E27.133 |
| 7,564,385 B2 | 7/2009 | Soude et al. | |
| 7,800,427 B2 | 9/2010 | Chae et al. | |
| 8,823,283 B2* | 9/2014 | Kesterson | 315/186 |
| 2002/0047792 A1* | 4/2002 | Van Den Boom | H03M 1/0678 341/144 |
| 2011/0050967 A1* | 3/2011 | Matsumoto | H03M 1/745 348/294 |
| 2012/0139523 A1* | 6/2012 | Kondo | G06G 3/30 323/313 |
| 2013/0241427 A1* | 9/2013 | Kesterson | H05B 37/02 315/210 |

FOREIGN PATENT DOCUMENTS

| | | |
|---|---|---|
| JP | 2008-219263 | 9/2008 |
| JP | 2011-193104 | 9/2011 |
| JP | 2012-74764 | 4/2012 |
| WO | 02/27940 | 4/2002 |

OTHER PUBLICATIONS

Y. Chae, et al., "A 2.1 M Pixels, 120 Frame/s CMOS Image Sensor With Column-Parallel ΔΣ ADC Architecture," IEEEJ. Solid-State Circuits, vol. 46, No. 1, pp. 236-247, Jan. 2011.

J. Markus, et al., "Theory and Applications of Incremental ΔΣ Convertors," IEEE TCAS-I, vol. 51, No. 4, pp. 678-690, Apr. 2004.

* cited by examiner

A/D CONVERTER, IMAGE SENSOR, AND DIGITAL CAMERA

TECHNICAL FIELD

The present invention relates to A/D converters, and particularly to an A/D converter provided in an image sensor.

BACKGROUND ART

In recent years, in the field of image sensors, analog-to-digital converter circuits (hereinafter, referred to as "A/D converters" or "ADCs") of various circuit types have been provided. In particular, Non Patent Literature (NPL) 1 discloses that a delta sigma analog-to-digital (ΔΣAD) converter is provided in an image sensor to cause the image sensor to offer a high accuracy and low power consumption.

Meanwhile, depending on performance of an image sensor, some images captured by the image sensor have a phenomenon called streaking. Streaking is a phenomenon in which, for example, when a bright point light source or the like is image-captured in the dark, white straight lines appear on the left and right sides of the point light source in the captured image. Streaking is also a phenomenon in which, for example, when a strong light source such as the sun is image-captured in daylight, band-like regions in changed color or regions in black appear on the left and right sides of the sun on the captured image.

CITATION LIST

Non Patent Literature

[NPL 1] Y. Chae, et al., "A 2.1M Pixels, 120 Frames/s CMOS Image Sensor With Column-Parallel ΔΣADC Architecture," IEEE J. Solid-State Circuits, vol. 46, no. 1, pp. 236-247, January 2011.
[NPL 2] J. Markus, et al., "Theory and Applications of Incremental ΔΣ Convertors," IEEE TCAS-I, vol. 51, no. 4, pp. 678-690, April 2004.

SUMMARY OF INVENTION

Technical Problem

In order to address the above, an object of the present invention is to provide an A/D converter capable of suppressing occurrence of streaking described as above.

Solution to Problem

In accordance with an aspect of the present invention, there is provided an analog-to-digital (A/D) converter including: an A/D converter circuit that causes a first current which is a dissipation current having dependence on an input voltage; and a counteracting current generation circuit that generates a second current which is a dissipation current for reducing the dependence of the first current on the input voltage, the counteracting current generation circuit being controlled based on an output digital value outputted from the A/D converter circuit according to the input voltage.

Advantageous Effects of Invention

The A/D converter according to the present invention is capable of suppressing occurrence of streaking.

DESCRIPTION OF EMBODIMENTS

Observation Based on which Present Invention is Conceived

As described above, phenomenon called streaking sometimes occurs in images captured by image sensors.

First, a structure and operations of an image sensor will be described with reference to an example.

Figure 1:
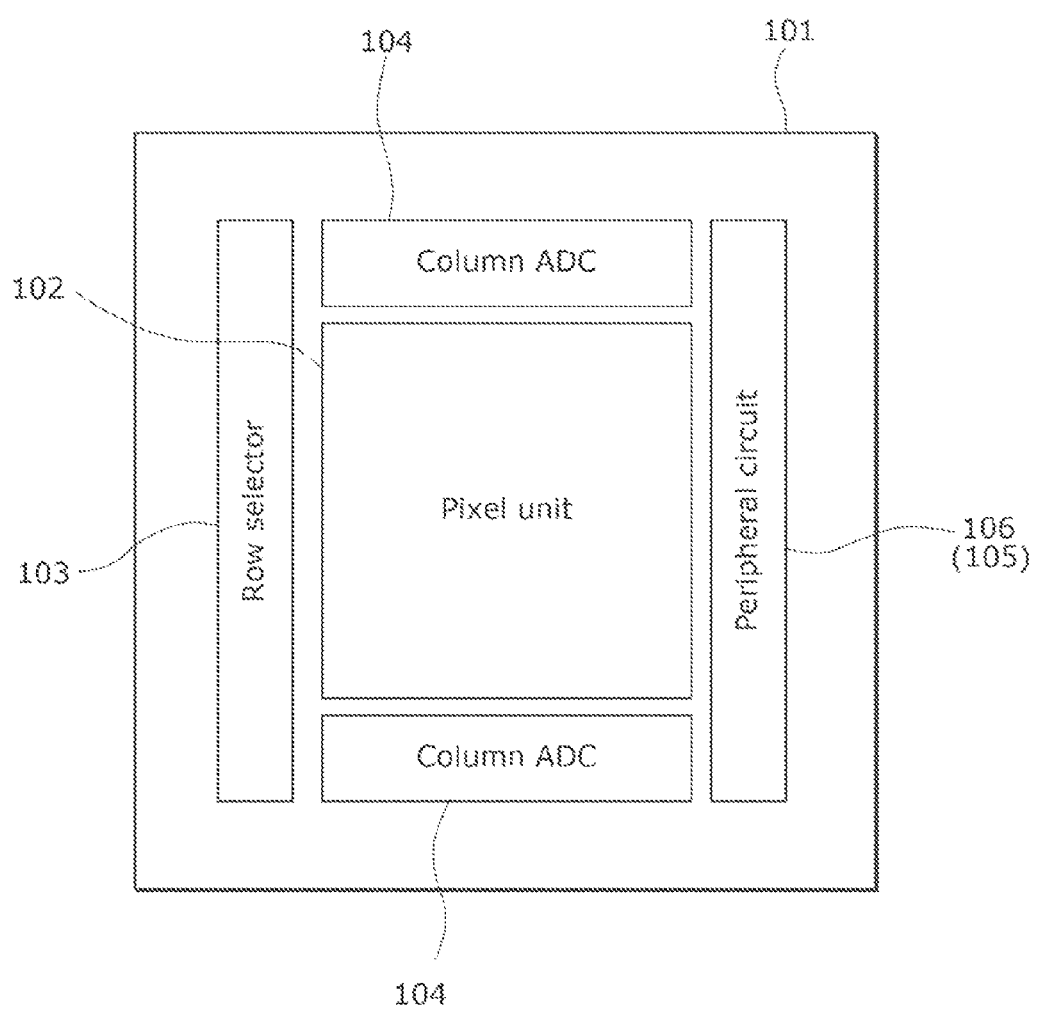
FIG. 1 is a block diagram illustrating an example of an appearance of an image sensor.

FIG. 1 is a block diagram illustrating an example of an appearance of an image sensor.

Figure 2:
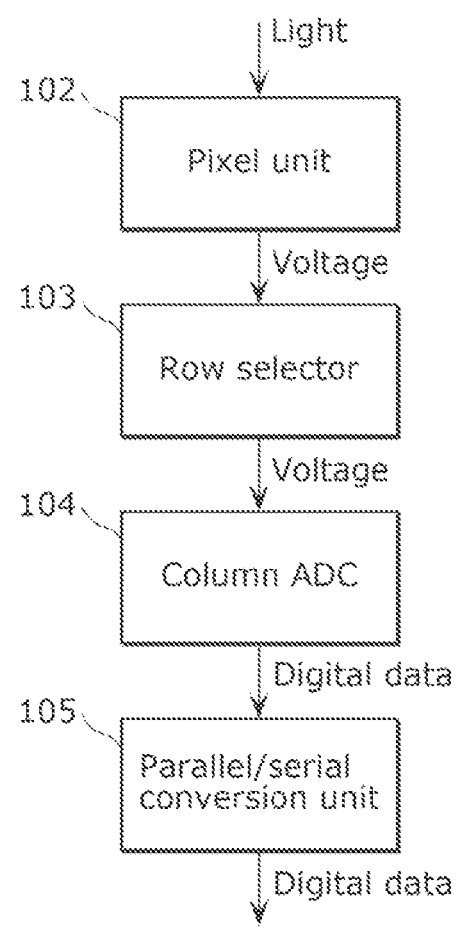
FIG. 2 is a block diagram illustrating a functional structure of the image sensor of FIG. 1.

FIG. 2 is a block diagram illustrating a functional structure of the image sensor of FIG. 1.

The image sensor 101 illustrated in FIGS. 1 and 2 includes a pixel unit 102, a row selector 103, a column ADC 104, and a parallel/serial conversion unit 105. In FIG. 1, the parallel/serial conversion unit 105 is provided in a peripheral circuit 106.

The following describes in brief operations performed by the image sensor illustrated in FIGS. 1 and 2.

First, light is incident on each of photoelectric conversion elements (for example, photodiodes) in the pixel unit 102, and a corresponding voltage is outputted to the row selector 103.

Next, the row selector 103 provides the column ADC 104 with output voltages corresponding to a single row of pixels in the pixel unit 102. The column ADC 104 includes a plurality of ADCs 107 and performs analog-to-digital conversion on the output voltages of the pixel unit 102 to generate digital data. The generated digital data is converted by the parallel/serial conversion unit 105 to be outputted to the outside of the image sensor 101.

Figure 3:
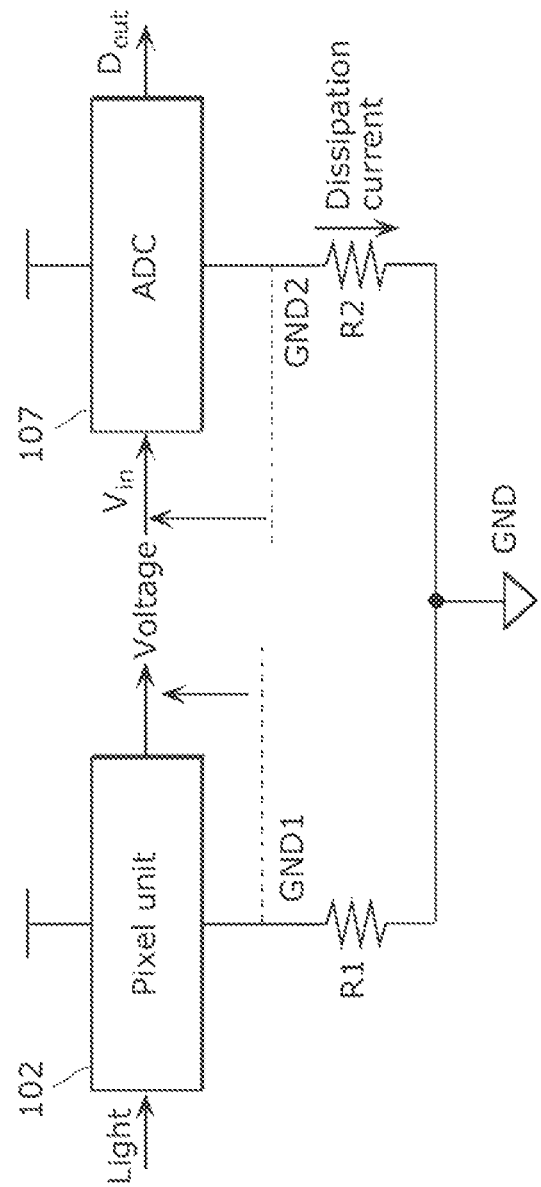
FIG. 3 is a diagram illustrating a reference voltage at a pixel unit and a reference voltage at an ADC.

FIG. 3 is a diagram illustrating a reference voltage at the pixel unit 102 and a reference voltage at an ADC 107. In FIG. 3, the row selector 103 is not illustrated.

As illustrated in FIG. 3, the pixel unit 102 and the ADC 107 independently have an impedance R1 and an impedance R2, respectively, on each path to a shared ground (GND). In other words, the pixel unit 102 outputs a voltage with reference to a GND 1, and the ADC 107 receives a voltage (input voltage $V_{in}$) with reference to a GND 2. Therefore, if a dissipation current of the ADC 107 (dissipation current flowing in the impedance R2 in FIG. 3) has dependence on the input voltage $V_{in}$, an output of the ADC varies according to the input voltage Vin. It should be noted that in the description, the dependence of the dissipation current on the input voltage $V_{in}$ means that there is some correlation between a value of the input voltage and a value of the dissipation current.

Figure 4:
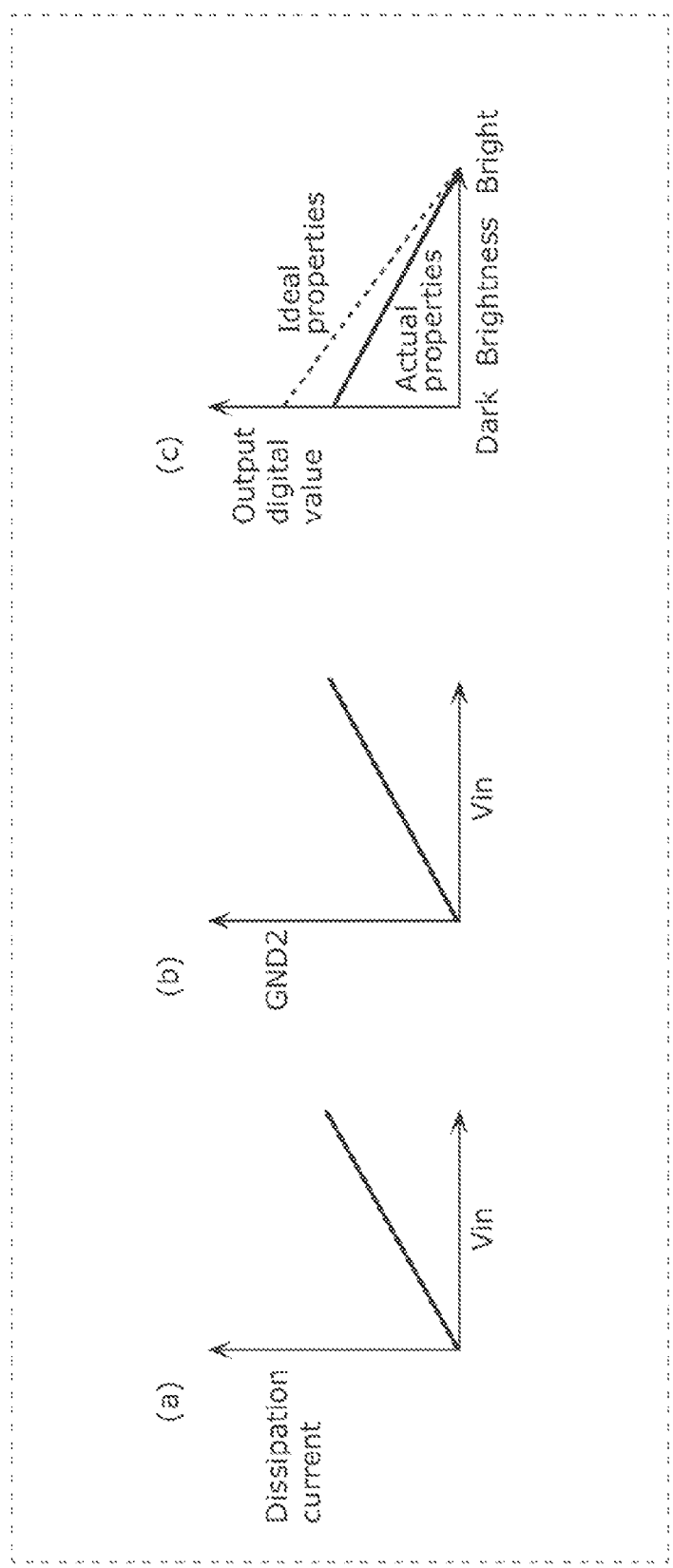
FIG. 4 shows graphs for explaining dependence of a dissipation current of the ADC on an input voltage.

FIG. 4 shows graphs for explaining the dependence of the dissipation current on the input voltage in the ADC.

(a) of FIG. 4 shows dependence of a dissipation current flowing into the shared GND on the input voltage $V_{in}$. Here, the impedance R2 causes a potential of the GND 2 to have properties as seen in (b) of FIG. 4. In other words, as seen in (c) of FIG. 4, $V_{in}$ (actual properties) is lower than ideal $V_{in}$ (ideal properties) that is generated with reference to the shared GND.

Here, in general, a voltage outputted from a photoelectric conversion element is inversely proportional to a brightness of light incident on the photoelectric conversion element. Therefore, the light incident on the pixel unit 102 and the digital value outputted from the ADC 107 have the properties as seen in (c) of FIG. 4. In other words, as a brightness of light incident on the pixel unit 102 is lower (darker), the difference between the actual properties and the ideal properties increases.

Next, streaking is described.

Figure 5:
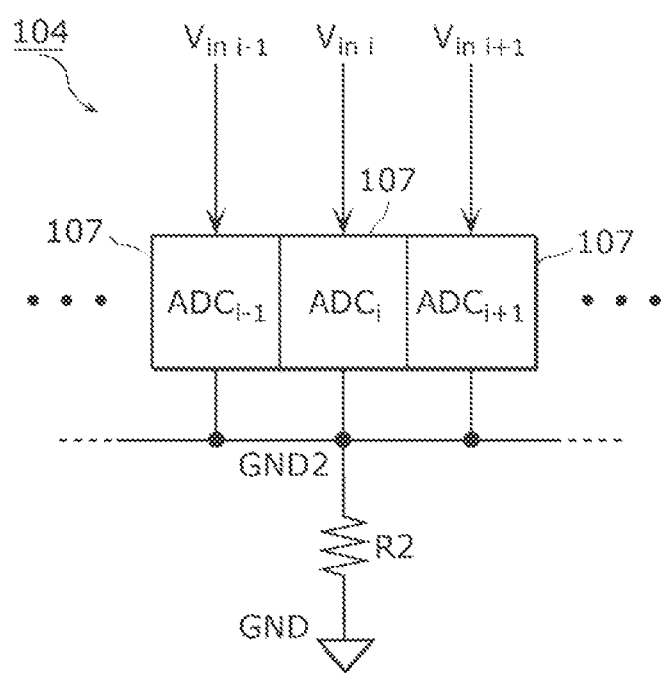
FIG. 5 is a diagram illustrating a structure of column ADCs.

FIG. 5 is a diagram illustrating a structure of the column ADC.

Figure 6:
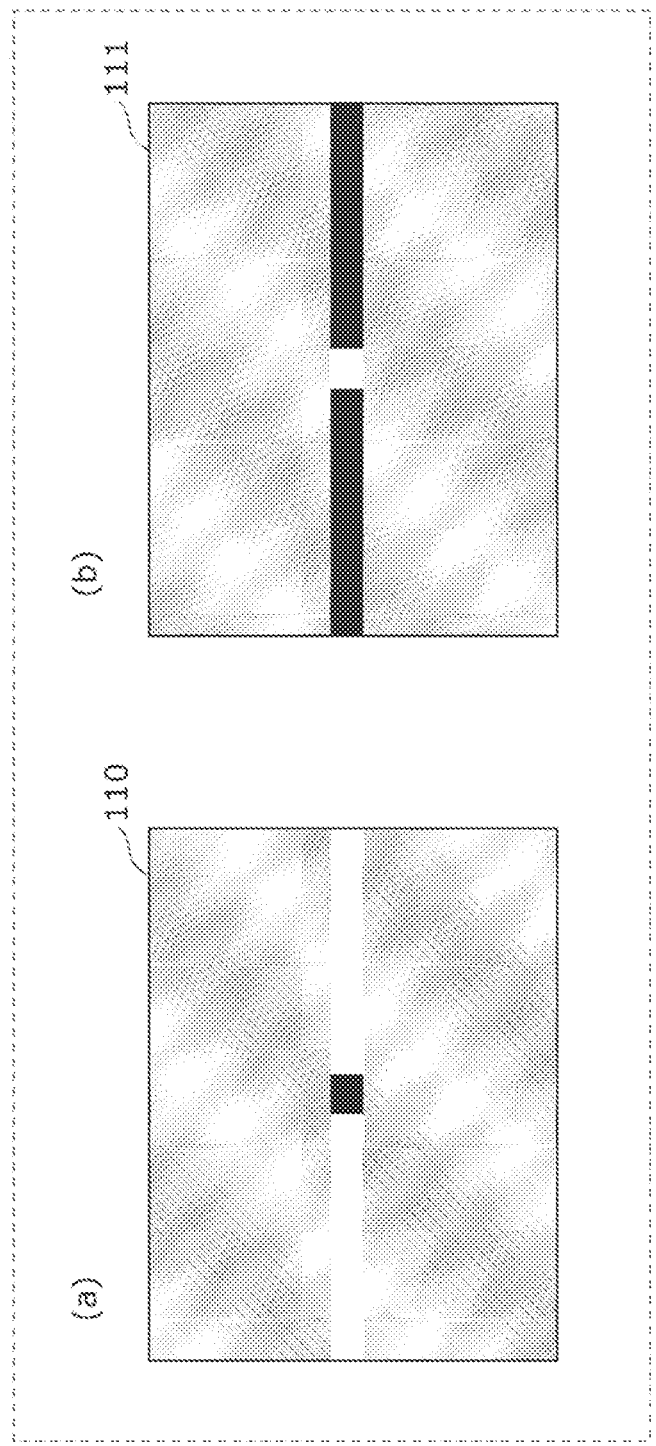
FIG. 6 shows diagrams illustrating images in which streaking occurs.

FIG. 6 shows diagrams illustrating images in which streaking occurs.

As illustrated in FIG. 5, the column ADC 104 includes a plurality of ADCs 107 ($ADC_{i-1}$, $ADC_i$, $ADC_{i+1}$) which are connected in parallel. The ADCs 107 included in the column ADC 104 share the same impedance R2 on a path to a shared GND.

If the image sensor 101 is used to capture an image of an object that has a homogeneous brightness for the entire region except a certain black region, a dissipation current flowing from the ADCs 107 for pixels corresponding to the black region to the impedance R2 is increased. Therefore, the potential of the GND 2 is increased. As a result, input voltages $V_{in}$ (among $V_{in\ i-1}$, $V_{in\ i}$, $V_{in\ i+1}$) of the other ADCs 107 connected in parallel are decreased by the increase of the potential of the GND 2, and the other ADCs 107 output digital values that are offset to offer a brightness higher than an actual brightness. In other words, partial low luminance pixels change digital values of the other pixels in the same row.

As a result, as seen in (a) of FIG. 6, an image 110 in which a white band-like streaking occurs is obtained.

On the other hand, if the image sensor 101 is used to capture an image of an object that has a homogeneous brightness for the entire region except a certain white region, a dissipation current flowing from ADCs 107 for pixels corresponding to the white region to the impedance R2 is decreased. Therefore, the potential of the GND 2 is decreased. As a result, input voltages $V_{in}$ of the other ADCs 107 connected in parallel are increased by the decrease of the potential of the GND 2, and the other ADCs 107 output digital values that are offset to offer a brightness lower than an actual brightness. In other words, partial high luminance pixels change digital values of the other pixels in the same row.

As a result, as seen in (b) of FIG. 6, an image 111 in which a black band-like streaking occurs is obtained.

In order to reduce such streaking, it is vital to reduce (or smooth) the dependence of the dissipation current of the ADCs 107 on the input voltage $V_{in}$.

The dependence of the dissipation current of the ADCs 107 on the input voltage $V_{in}$ caused by a switched-capacitor technique commonly used for the ADCs 107.

Although there are various types of ADCs, such as a cyclic ADC, an SAR ADC, and a ΔΣ modulation ADC, their basic element circuits are switched-capacitor circuits.

Figure 7:
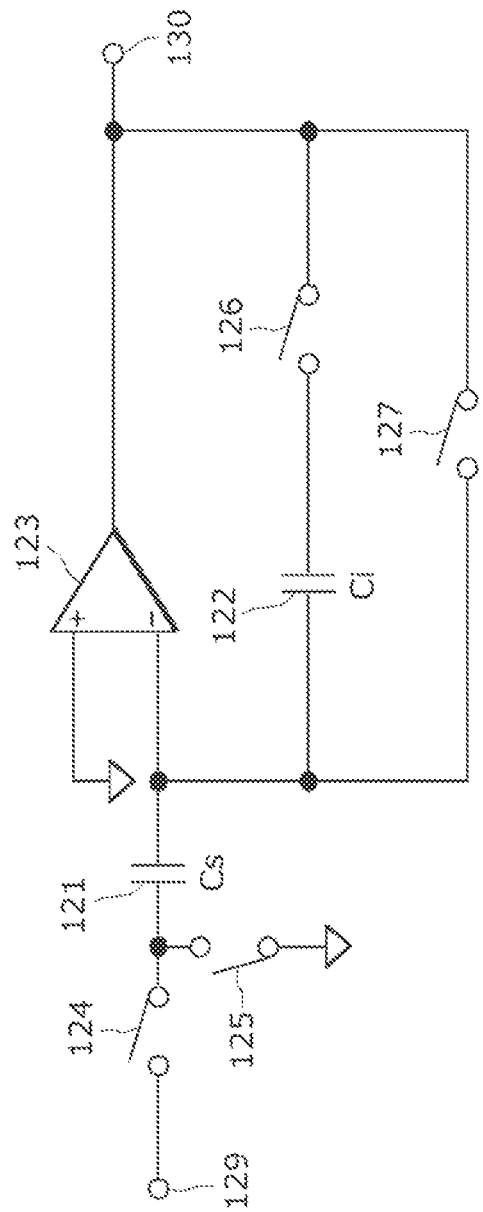
FIG. 7 is a circuit diagram of a switched-capacitor integrator.

FIG. 7 is a circuit diagram of a switched-capacitor integrator that is an example of the switched-capacitor circuit.

The following describes the situation where in the circuit illustrated in FIG. 7, a sampling capacitor 121 is charged and discharged.

The sampling capacitor 121 has one terminal that is virtually grounded by an operating amplifier 123. Therefore, an amount of charging/discharging of the sampling capacitor 121 is determined based on a potential at the other terminal of the sampling capacitor 121, in other words, a voltage applied to an input terminal 129.

Here, electrostatic capacitance of the sampling capacitor 121 is expressed as Cs [F], and a voltage $V_{in}$ [V] is assumed to be applied to the input terminal 129. If a switch 124 is short-cut and a switch 125 is open, the other terminal of the sampling capacitor 121 is rest to have the voltage $V_{in}$ [V]. Therefore, the sampling capacitor 121 is charged with electrical charges $CsV_{in}$ [C].

Next, if the switch 124 is open and the switch 125 is short-cut, the other terminal of the sampling capacitor 121 is grounded to GND. Therefore, the electrical charges $Cs \cdot V_{1n}$ [C] in the sampling capacitor 121 are discharged via the GND.

As described above, for the A/D converter having a switched-capacitance circuit as a basic element circuit, it is an essential problem that a dissipation current of the A/D converter has dependence on inputs.

In accordance with an aspect of the present invention for solving the above problems, there is provided an analog-to-digital (A/D) converter including: an A/D converter circuit that causes a first current which is a dissipation current having dependence on an input voltage; and a counteracting current generation circuit that generates a second current which is a dissipation current for reducing the dependence of the first current on the input voltage, the counteracting current generation circuit being controlled based on an output digital value outputted from the A/D converter circuit according to the input voltage.

With the above structure, by generating the second current by the counteracting current generation circuit, it is possible to reduce the dependence of the dissipation current of the A/D converter circuit on the input voltage. As a result, provision of the above-described A/D converter to an image sensor can suppress occurrence of streaking.

It is also possible, for example, that the counteracting current generation circuit generates the second current to cause a current obtained by adding the first current and the second current together to be substantially invariant to a value of the input voltage.

It is further possible, for example, that if the first current is larger as the input voltage is higher, the counteracting current generation circuit generates the second current to be smaller as the input voltage is higher.

It is still further possible, for example, that the A/D converter circuit is a delta sigma analog-to-digital (ΔΣAD) converter circuit.

It is still further possible, for example, that the A/D converter circuit includes: a subtractor that subtracts a reference voltage from the input voltage to output a first signal; a first integrator that integrates the first signal to output a second signal; a second integrator that integrates the second signal to output a third signal; an adder that adds the input voltage, the second signal, and the third signal together to output a fourth signal; a comparator that compares the fourth signal to a predetermined threshold to output the output digital value; and a 1-bit digital-to-analog (D/A) converter that generates the reference voltage according to the output digital value.

Figure 10:
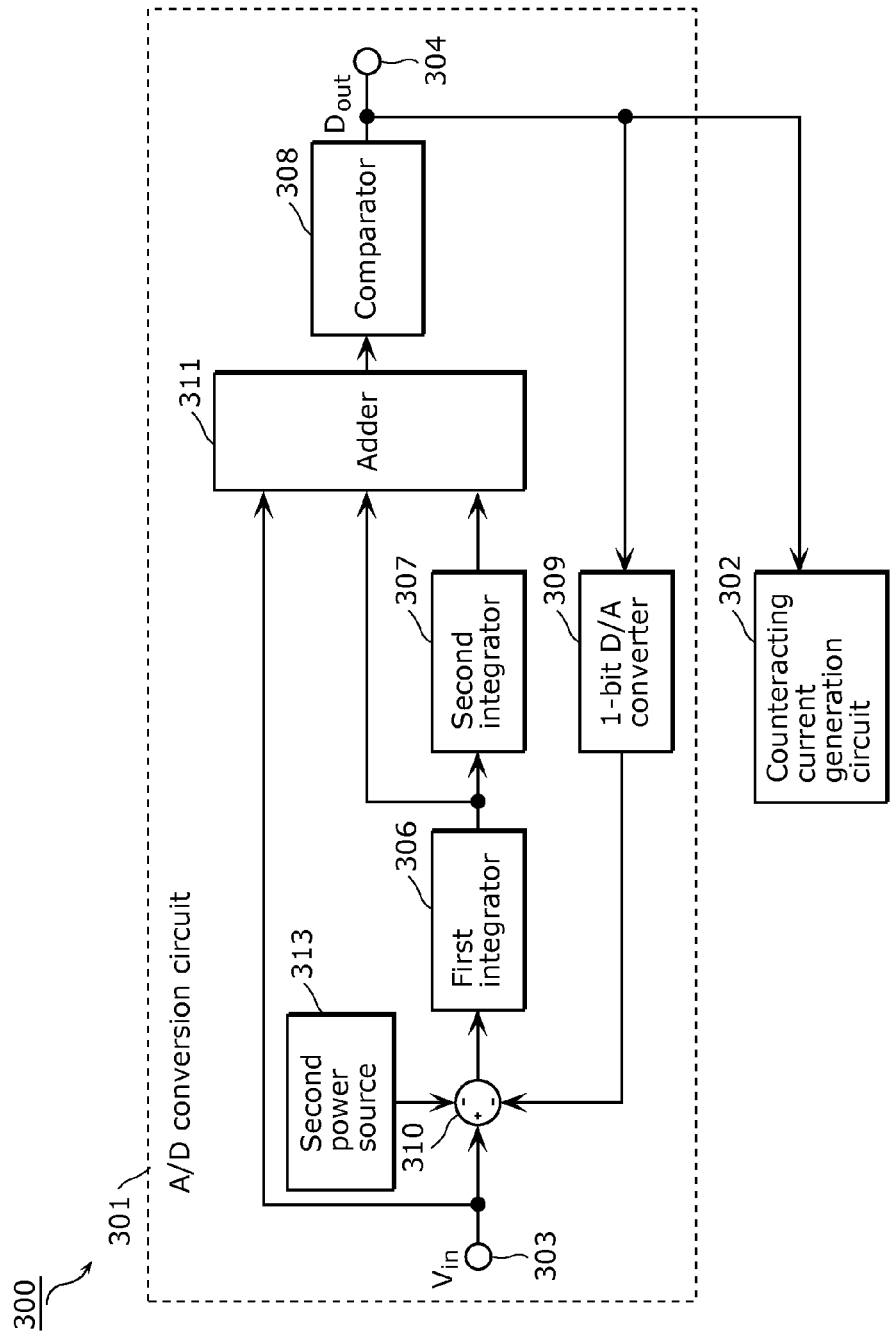
FIG. 10 is a block diagram illustrating a circuit structure of the A/D converter according to the first embodiment.

In other words, the counteracting current generation circuit can be added to the A/D converter circuit having a structure as illustrated in FIG. 10.

It is still further possible, for example, that the A/D converter circuit includes: a first subtractor that subtracts a first reference voltage from the input voltage to output a first signal; a first integrator that integrates the first signal to output a second signal; a second subtractor that subtracts a second reference voltage from the second signal to output a third signal; a second integrator that integrates the third signal to output a fourth signal; a comparator that compares the fourth signal to a predetermined threshold to output the output digital value; a first 1-bit D/A converter that generates the first reference voltage according to the output digital value; and a second 1-bit D/A converter that generates the second reference voltage according to the output digital value.

Figure 23:
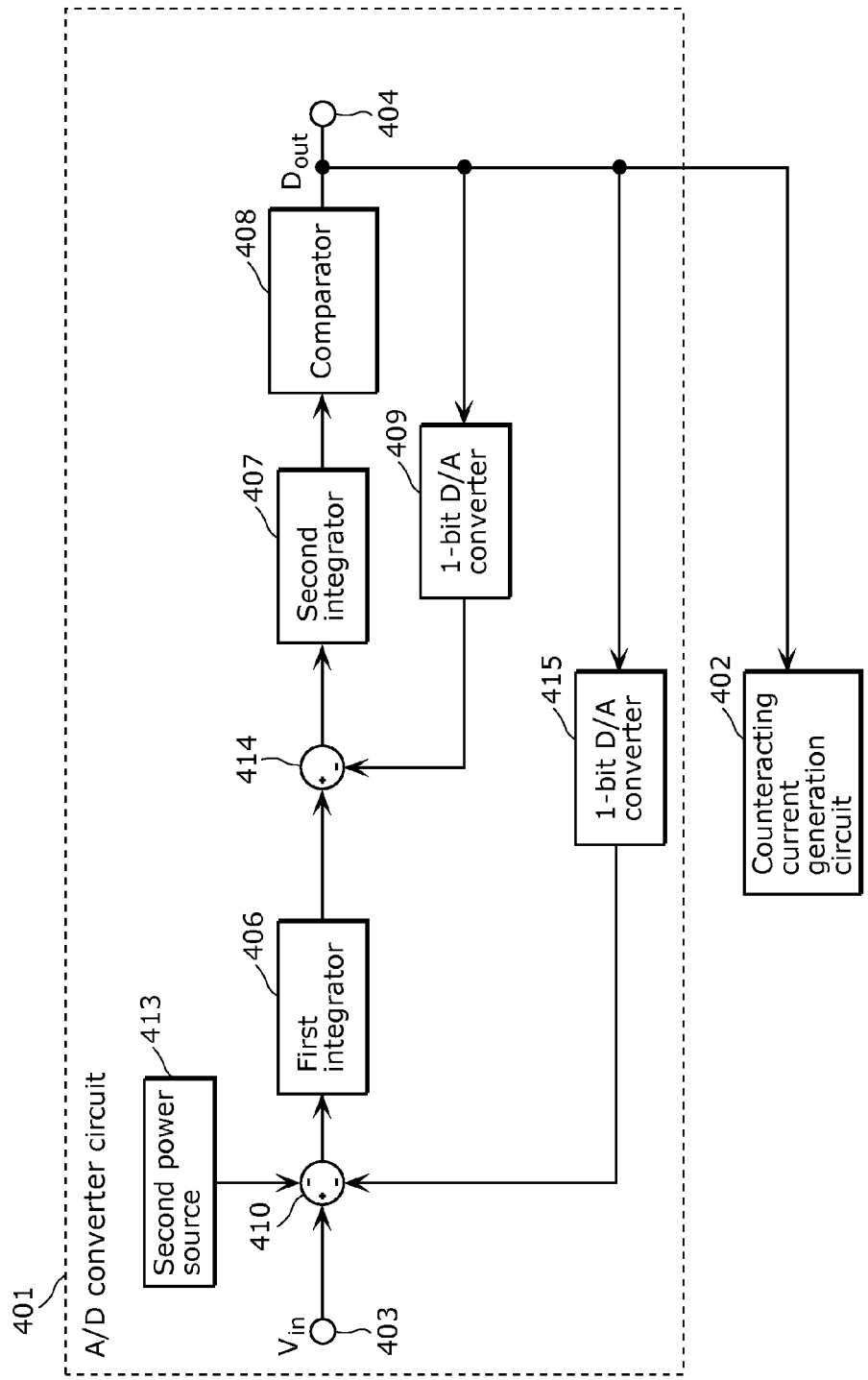
FIG. 23 is a block diagram illustrating a circuit structure of the A/D converter according to the second embodiment.

In other words, the counteracting current generation circuit can be added to the A/D converter circuit having a structure as illustrated in FIG. 23.

It is still further possible, for example, that the first current is a dissipation current that flows into a first power source, and the counteracting current generation circuit includes: an inverting circuit that inverts the output digital value to be outputted; a capacitor having one end connected to a second power source; a first switch that controls electrical connection between an output terminal of the inverting circuit and an other end of the capacitor according to a first clock signal; and a second switch that controls electrical connection between the other end of the capacitor and the first power source according to a second clock signal, wherein the second clock signal is low when the first clock signal is high, and the second clock signal is high when the first clock signal is low, and if the first switch electrically connects the output terminal of the inverting circuit to the other end of the capacitor when the first clock signal is high, the second switch electrically connects the other end of the capacitor to the first power source when the second clock signal is high.

Figure 36:
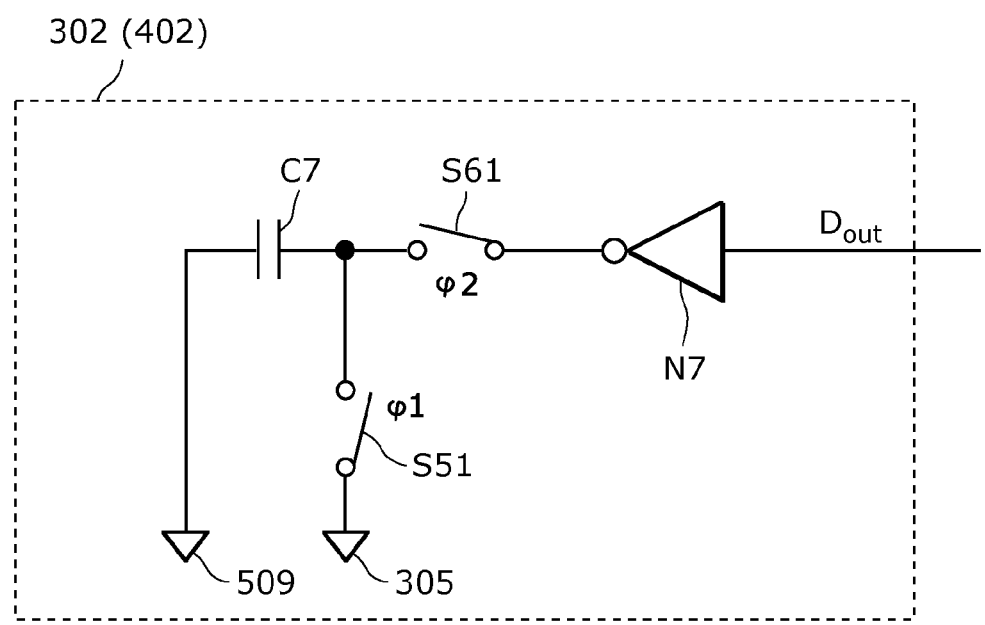
FIG. 36 is a diagram illustrating another example of the counteracting current generation circuits according to the first and second embodiments.

In other words, the counteracting current generation circuit may have a structure, for example, as illustrated in FIG. 36.

It is still further possible, for example, that the first current is a dissipation current that flows into a first power source, and the counteracting current generation circuit includes: a correction code generation circuit that generates a correction code from the output digital value; a capacitor having one end connected to a second power source; a first switch that controls electrical connection between an output terminal of the correction code generation circuit and an other end of the capacitor according to a first clock signal; and a second switch that controls electrical connection between the other end of the capacitor and the first power source according to a second clock signal, wherein the second clock signal is low when the first clock signal is high, and the second clock signal is high when the first clock signal is low, if the first switch electrically connects the output terminal of the correction code generation circuit to the other end of the capacitor when the first clock signal is high, the second switch electrically connects the other end of the capacitor to the first power source when the second clock signal is high, and the correction code varies according to a clock cycle of one of the first clock signal and the second clock signal in a period in which the output digital value does not vary according to the clock cycle.

Figure 37:
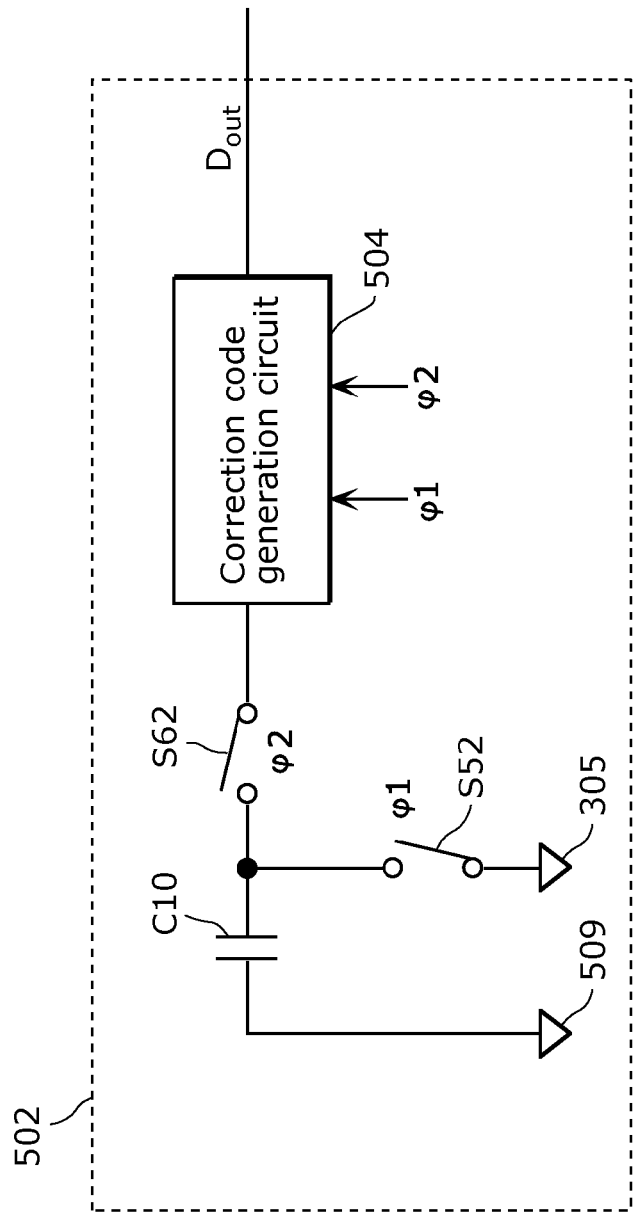
FIG. 37 is a diagram illustrating another example of the counteracting current generation circuit according to the third embodiment.

In other words, the counteracting current generation circuit may have a structure, for example, as illustrated in FIG. 37.

In accordance with another aspect of the present invention, there is provided an image sensor including the above-described A/D converter.

The image sensor having the above structure can suppress occurrence of streaking.

In accordance with still another aspect of the present invention, there is provided a digital camera including the above-described image sensor.

The digital camera having the above structure can suppress occurrence of streaking.

Hereinafter, certain exemplary embodiments will be described in greater detail with reference to the accompanying Drawings. It should be noted that all the embodiments described below are generic and specific examples of the present invention. Numerical values, shapes, materials, constituent elements, arrangement positions and the connection configuration of the constituent elements, steps, the order of the steps, and the like described in the following embodiments are merely examples, and are not intended to limit the present invention. Therefore, among the constituent elements in the following embodiments, constituent elements that are not described in independent claims that show the most generic concept of the present invention are described as elements constituting more desirable configurations.

First Embodiment

Figure 8:
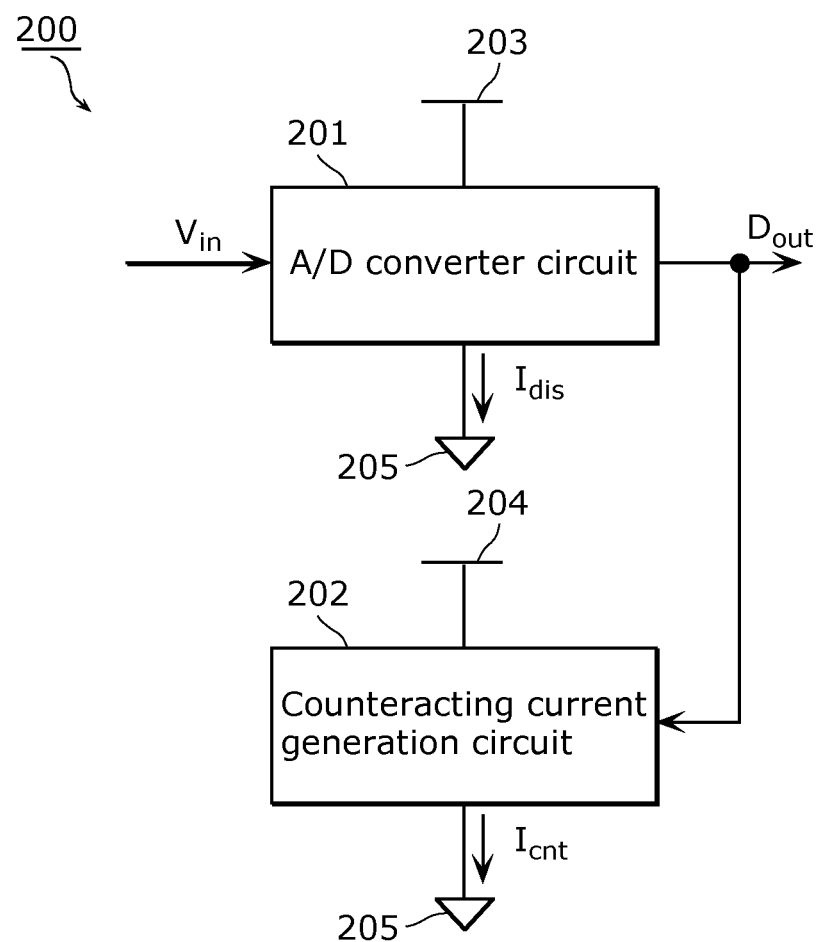
FIG. 8 is a block diagram illustrating a basic structure of an A/D converter according to embodiments of the present disclosure.

FIG. 8 is a block diagram illustrating a basic structure of an A/D converter according to the embodiments of the present disclosure.

In FIG. 8, an A/D converter 200 includes an A/D converter circuit 201 and a counteracting current generation circuit 202.

The A/D converter circuit 201 is connected to a first power source 205 and a third power source 203. The A/D converter circuit 201 converts an input voltage $V_{in}$ to a digital value to be outputted. The A/D converter circuit 201 causes a dissipation current $I_{dis}$ (first current) that has dependence on the input voltage and flows into the first power source 205.

The counteracting current generation circuit (correct current generation circuit) 202 is connected to the first power source 205 and a fourth power source 204. The counteracting current generation circuit 202 is controlled based on the output digital value of the A/D converter circuit 201 to generate a dissipation current (correct signal) $I_{cnt}$ (second current) to flow into the first power source 205.

The dependence of the dissipation current $I_{dis}$ on the input voltage $V_{in}$ and the dependence of the dissipation current $I_{cnt}$ on the input voltage $V_{in}$ are opposite. More specifically, as the input voltage $V_{in}$ is higher, the dissipation current $I_{dis}$ is larger and the dissipation current $I_{cnt}$ is smaller.

In the A/D converter 200, a dissipation current obtained by adding the dissipation current $I_{dis}$ and the dissipation current $I_{cnt}$ together has properties of being independent from (substantially invariant to) the input voltage $V_{in}$.

In a first embodiment, as the A/D converter circuit, an A/D converter 300 having a feed forward (FF) second-order ΔΣAD converter circuit will be described.

Figure 9:
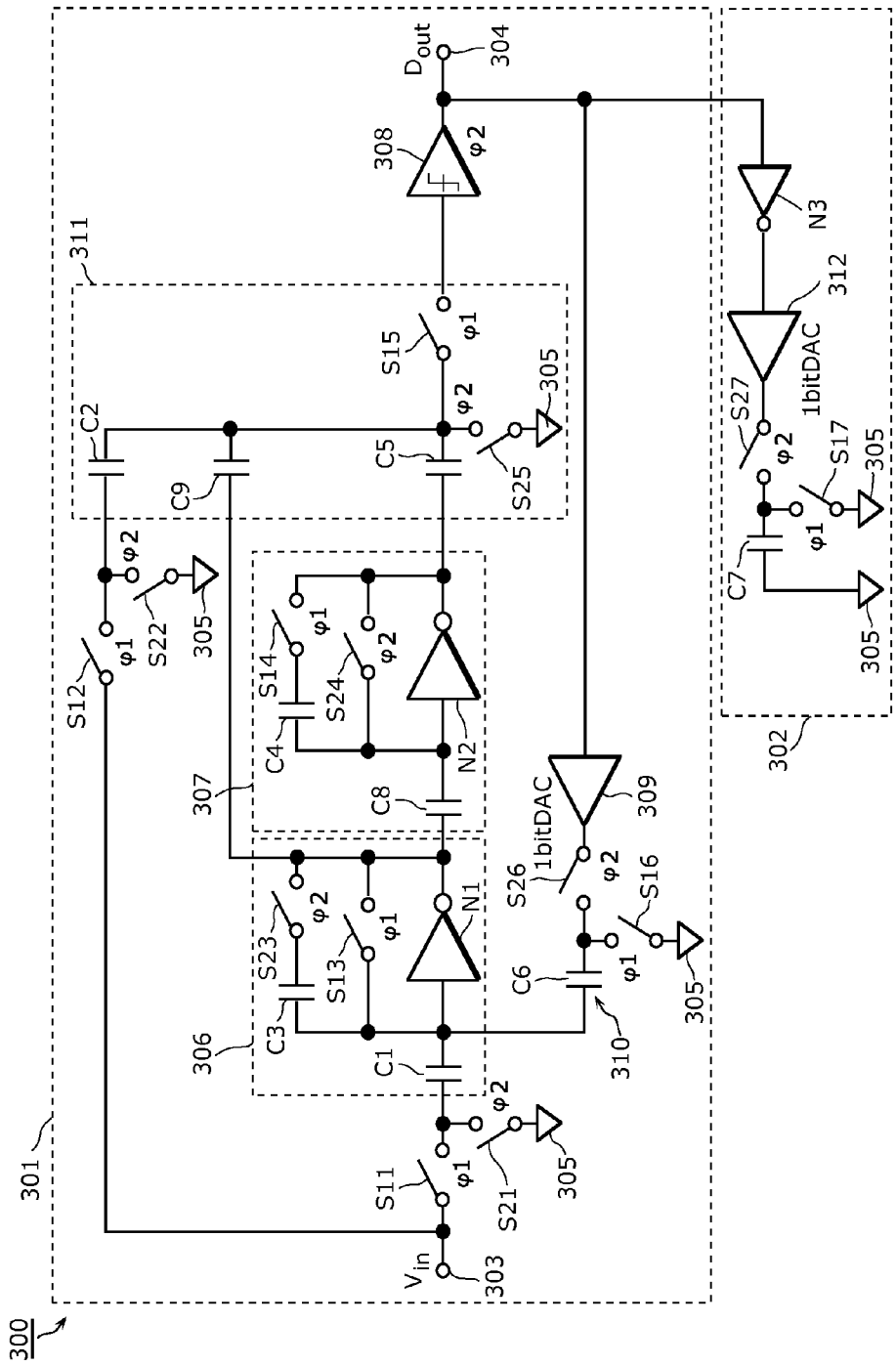
FIG. 9 is a circuit diagram illustrating an A/D converter according to the first embodiment.

FIG. 9 is a circuit diagram of the A/D converter 300.

FIG. 10 is a block diagram illustrating a circuit structure of the A/D converter 300.

The A/D converter 300 includes an A/D converter circuit 301 and a counteracting current generation circuit 302. The A/D converter circuit 301 is an FF second-order ΔΣAD converter circuit that operates in synchronization with a clock signal φ1 and a clock signal φ2.

It should be noted that the clock signal φ1 and the clock signal φ2 have a mutually complementary relationship. More specifically, in a period in which the clock signal φ1 is high, the clock signal φ2 is low. In a period in which the clock signal φ1 is low, the clock signal φ2 is high.

Here, first, the A/D converter circuit 301 and a dissipation current caused by the A/D converter circuit 301 will be described.

As illustrated in FIGS. 9 and 10, the A/D converter circuit 301 includes a first integrator 306, a second integrator 307, a comparator 308, a 1-bit D/A converter 309, a subtractor 310, an adder 311, a first power source 305, an input terminal 303, and an output terminal 304. In other words, the A/D converter circuit 301 includes inverting amplifiers N1 to N3, switches S11 to S17, switches S21 to S27, and capacitors C1 to C9.

The subtractor 310 subtracts a reference voltage from an input voltage $V_{in}$ to output a resulting signal.

The first integrator 306 integrates the output signal of the subtractor 310.

The second integrator 307 integrates the output signal of the first integrator 306.

The adder 311 adds the input voltage $V_{in}$, the output signal of the first integrator 306, and the output signal of the second integrator 307 together.

The comparator 308 compares the output signal of the adder 311 to a predetermined threshold voltage to generate an output digital value $D_{out}$. The comparator 308 outputs, for example, a high output digital value $D_{out}$ when the output signal of the adder 311 is higher than or equal to the predetermined threshold voltage, and a low output digital value $D_{out}$ when the output signal of the adder 311 is lower than the predetermined threshold voltage.

The 1-bit D/A converter 309 outputs the reference voltage according to the output digital value $D_{out}$. More specifically, the 1-bit D/A converter 309 outputs a power source voltage $V_{dd}$ when the output digital value $D_{out}$ is high, and outputs a voltage at the first power source 305 when the output digital value $D_{out}$ is low.

Each of the switches S11 to S17 is turned ON/OFF according to the clock signal φ1. Each of the switches S21 to S27 is turned ON/OFF according to the clock signal φ2. For example, each of the switches is turned ON when a supplied clock signal is high, and turned OFF when a supplied clock signal is low.

Here, each of the switches may be turned ON when a supplied clock signal is low. In this case, theory of the clock signal φ1 and theory of the clock signal φ2 are inverted.

Although FIG. 10 illustrates also a second power source 313, the second power source 313 may be eliminated when the second power source 313 and the first power source 305 are equivalent to each other. In other words, if the second power source 313 is eliminated, the subtractor 310 may subtract an output digital value of the 1-bit D/A converter 309 not an output of the second power source 313 from the input voltage $V_{in}$.

Since the circuit operations of the A/D converter circuit 301 are disclosed in detail in Non Patent Literature 2, the circuit operations are not described herein.

Figure 11:
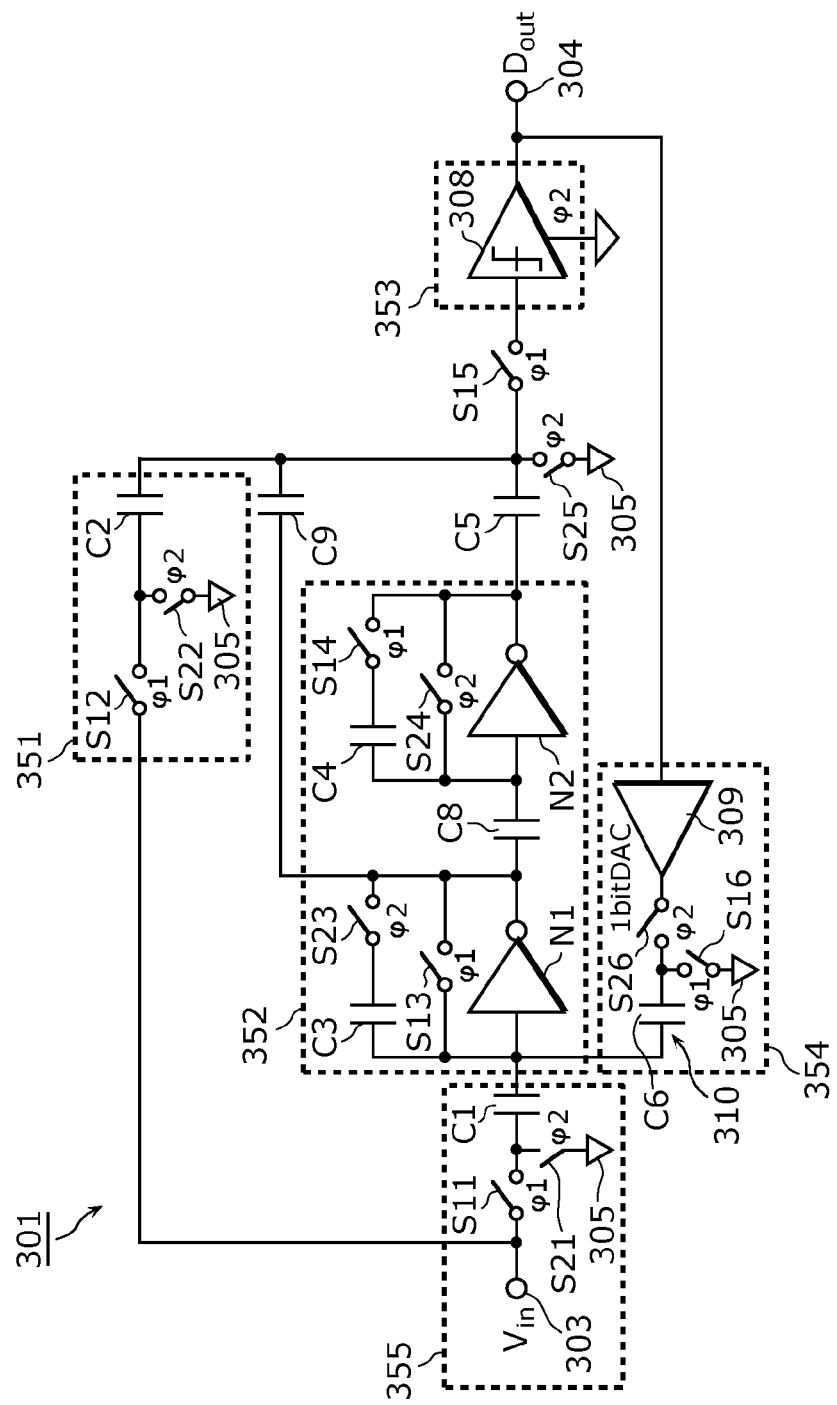
FIG. 11 is a diagram for explaining a dissipation current of the A/D converter circuit according to the first embodiment.

FIG. 11 is a diagram for explaining a dissipation current of the A/D converter circuit 301.

The following describes a path of the dissipation current of the A/D converter circuit 301 which flows to the first power source 305 (GND), for each of five blocks illustrated in FIG. 11. More specifically, the five blocks are a block 351, a block 352, a block 353, a block 354, and a block 355 which are illustrated in FIG. 11.

Figure 12:
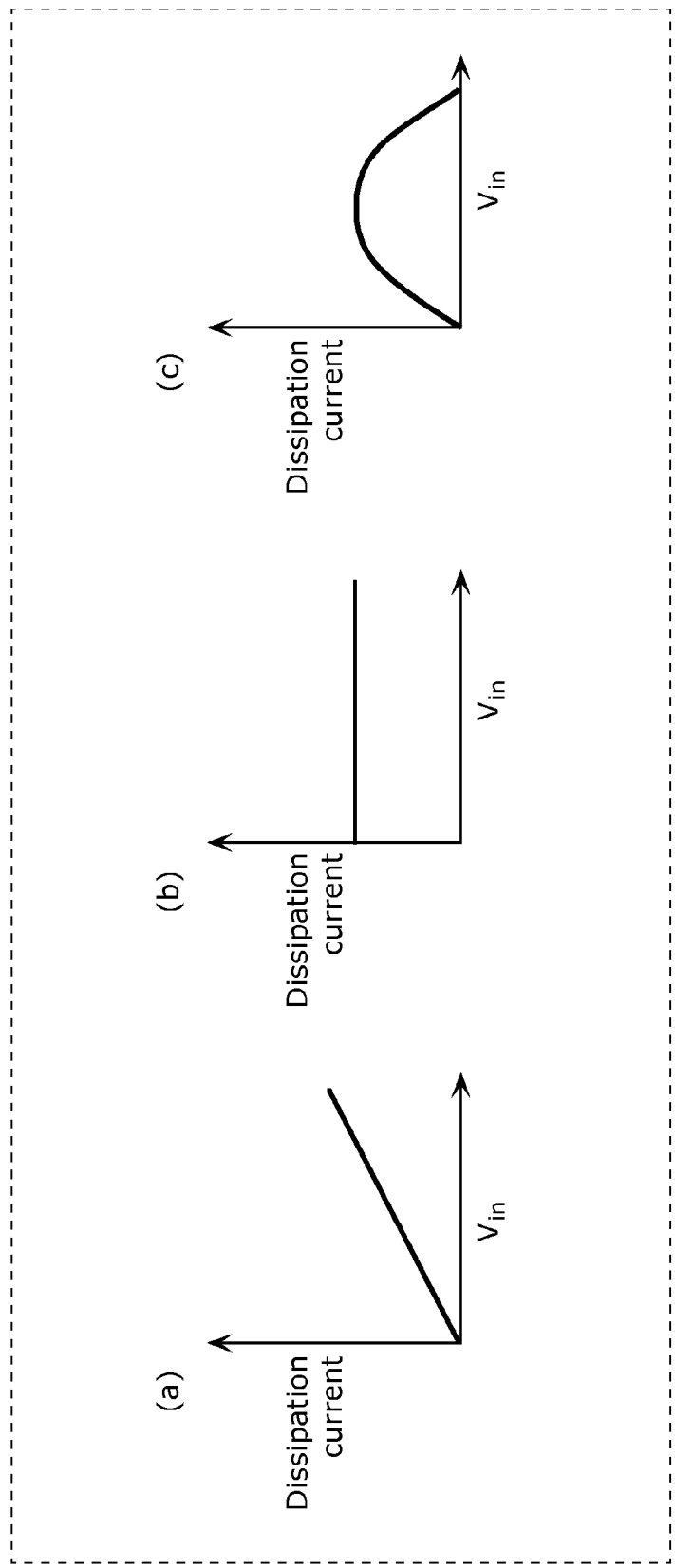
FIG. 12 shows graphs plotting a relationship between an input voltage and a dissipation current of each of the blocks illustrated in FIG. 11.

FIG. 12 shows graphs plotting a relationship between an input voltage $V_{in}$ and a dissipation current of each of the blocks illustrated in FIG. 11.

In the block 351, one end of the capacitor C2 is connected to the first power source 305 via the switch S22, and the other end of the capacitor C2 is connected to the first power source 305 via the switch S25. Therefore, every time the clock signal φ2 is set to high, one end and the other end of the capacitor C2 are connected to the first power source 305.

In addition, since one end of the capacitor C2 is connected to the input terminal 303 via the switch S12, the capacitor C2 is charged with electrical charges in proportion to the input voltage $V_{in}$ every time the clock signal φ1 is high.

Here, since the clock signals φ1 and φ2 have a mutually complementary relationship as described above, it can be considered that the other end of the capacitor C2 is virtually grounded because it is periodically connected to the first power source 305. In other words, the other end of the capacitor C2 can be considered as a DC bias point in average.

More specifically, the dissipation current flowing from the capacitor C2 to the first power source 305 is proportional to the input voltage $V_{in}$ as seen in (a) of FIG. 12.

In the block 352, the dissipation current flows into the first power source 305 via the inverting amplifiers N1 and N2. Here, the capacitors used for the two integrators in the block 352 periodically repeat charging and discharging. In the repetition, an amount of charging and an amount of discharging are equal to each other. Therefore, the dissipation current of the block 352 is independent from the input voltage $V_{in}$ as seen in (b) of FIG. 12. Therefore, it is not necessary to consider the dissipation current of the block 352 in the operation of the counteracting current generation circuit 302.

The circuits in the block 353 includes the comparator 308, which is in synchronization with a clock, and digital elements provided to the comparator 308. These circuits perform class C operation, and therefore a current dissipates only when the output digital value $D_{out}$ changes from high to low or from low to high.

Figure 13:
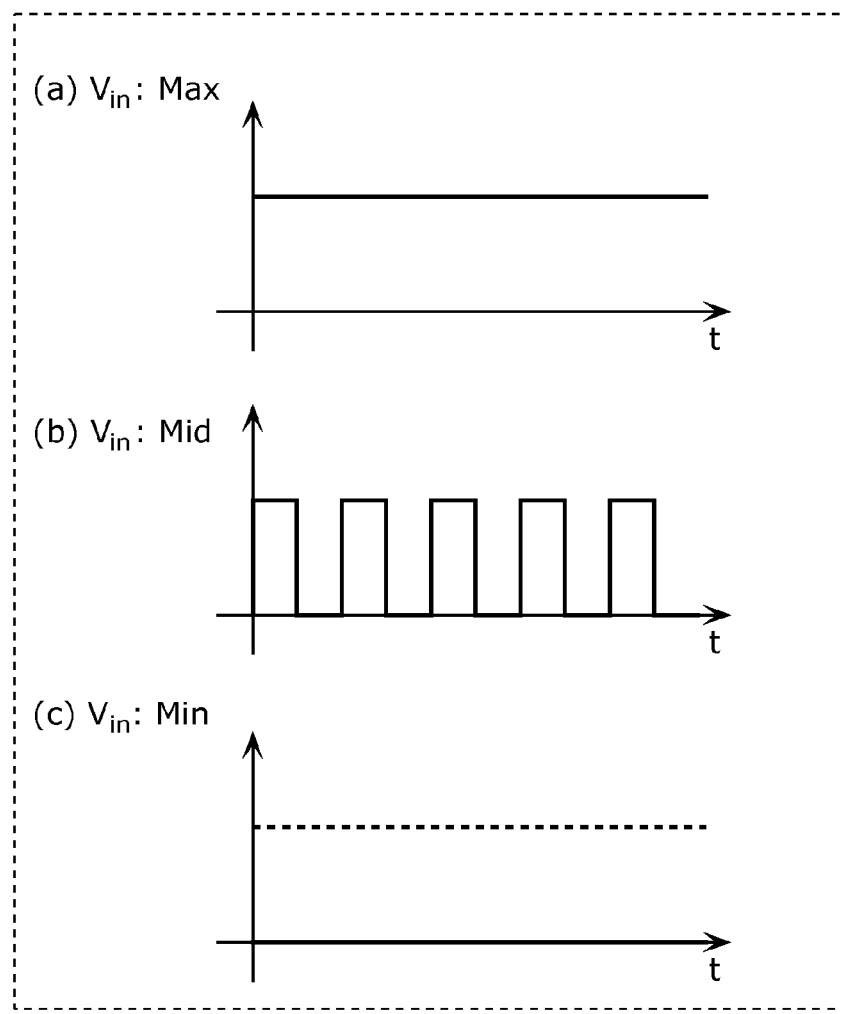
FIG. 13 shows graphs plotting a relationship between an input voltage and a waveform of an output digital value.

FIG. 13 shows graphs plotting a relationship between an input voltage $V_{in}$ and a waveform of an output digital value $D_{out}$.

As seen in (a) of FIG. 13, when the input voltage $V_{in}$ has a maximum value, the output digital value $D_{out}$ is high. As seen in (c) of FIG. 13, when the input voltage $V_{in}$ has a minimum value, the output digital value $D_{out}$ is low. As seen in (b) of FIG. 13, when the input voltage $V_{in}$ has an intermediate value between the maximum value and the minimum value, the output digital value $D_{out}$ is high and low in equal proportion. In other words, when the input voltage $V_{in}$ has the above intermediate value, a frequency of changing the output digital value $D_{out}$ from high to low or from low to high is high, and the dissipation current is large.

Therefore, the dissipation current of the block 353 has properties seen as a convex in (c) of FIG. 12. However, since these circuits in the block 353 include the digital elements, the GND for the circuits can be separated from the GNDs (first power sources) for the other circuits. If the GNDs are separated, it is not necessary to consider the dissipation current of the block 353 in the operation of the counteracting current generation circuit 302.

In the block 354, a dissipation current of the 1-bit D/A converter 309 depends on the output digital value $D_{out}$.

First, the situation where the output digital value $D_{out}$ is high will be described. In the following description, the power source voltage of the A/D converter circuit 301 is expressed as $V_{dd}$.

Figure 14:
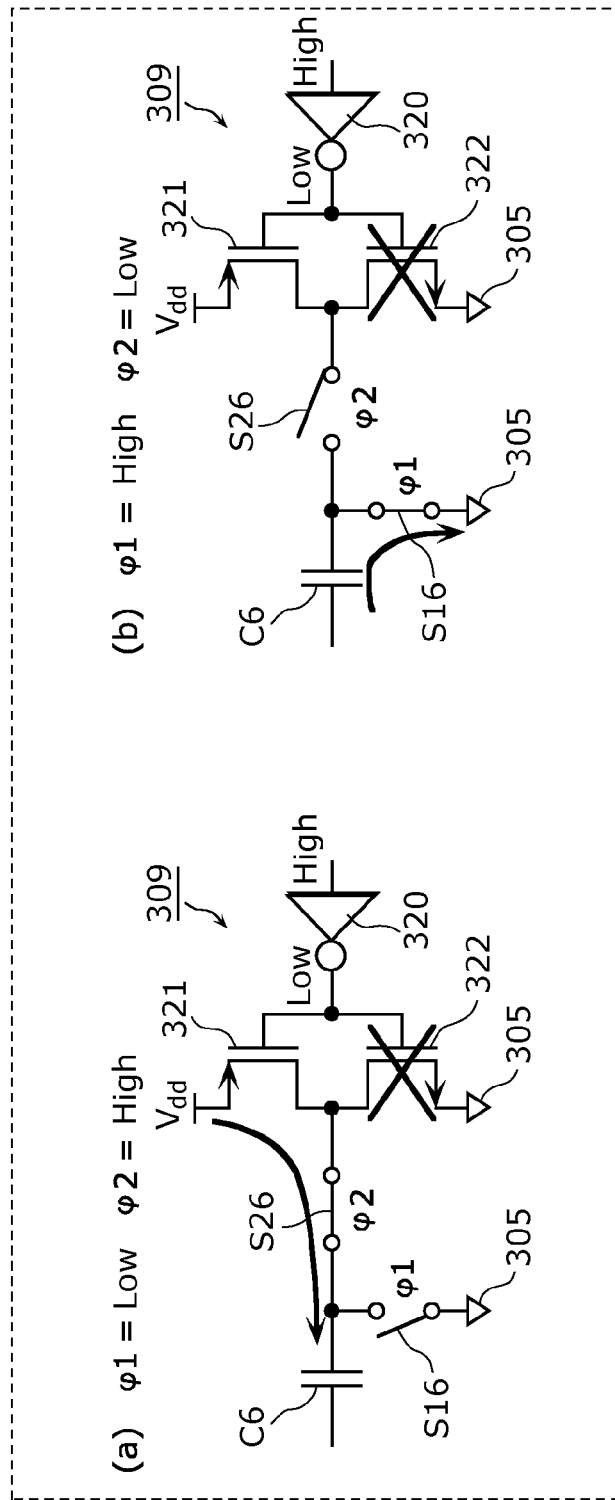
FIG. 14 shows diagrams for explaining a dissipation current of a 1-bit D/A converter when an output digital value is high.

FIG. 14 shows diagrams for explaining a dissipation current of the 1-bit D/A converter 309 when the output digital value $D_{out}$ is high. In FIG. 14, the 1-bit D/A converter 309 is described as an equivalent circuit that includes an inverting amplifier 320, a p-type metal oxide semiconductor (PMOS) transistor 321, and an n-type metal oxide semiconductor (NMOS) transistor 322.

When the clock signal φ1 is low (the clock signal φ2 is high), the connection relationship is as seen in (a) of FIG. 14. More specifically, in the connection relationship, the switch S16 is OFF, the switch S26 is ON, the PMOS transistor 321 is ON, and the NMOS transistor 322 is OFF.

Here, one end of the capacitor C6 is connected to receive the power source voltage $V_{dd}$ via the switch S26, and the other end of the capacitor C6 is virtually grounded via the inverting amplifier N1 (not illustrated). Therefore, the capacitor C6 is charged at the power source voltage $V_{dd}$.

Consequently, when the clock signal φ1 is changed to high (the clock signal φ2 is changed to low), the connection relationship becomes as seen in (b) of FIG. 14. More specifically, in the connection relationship, the switch S16 is ON, the switch S26 is OFF, the PMOS transistor 321 is ON, and the NMOS transistor 322 is OFF.

In this case, the electrical charges, which have been charged in the capacitor C6 while the clock signal φ1 is low, flow as a dissipation current into the first power source 305 via the switch S16.

Next, the situation where the output digital value $D_{out}$ is low is described.

Figure 15:
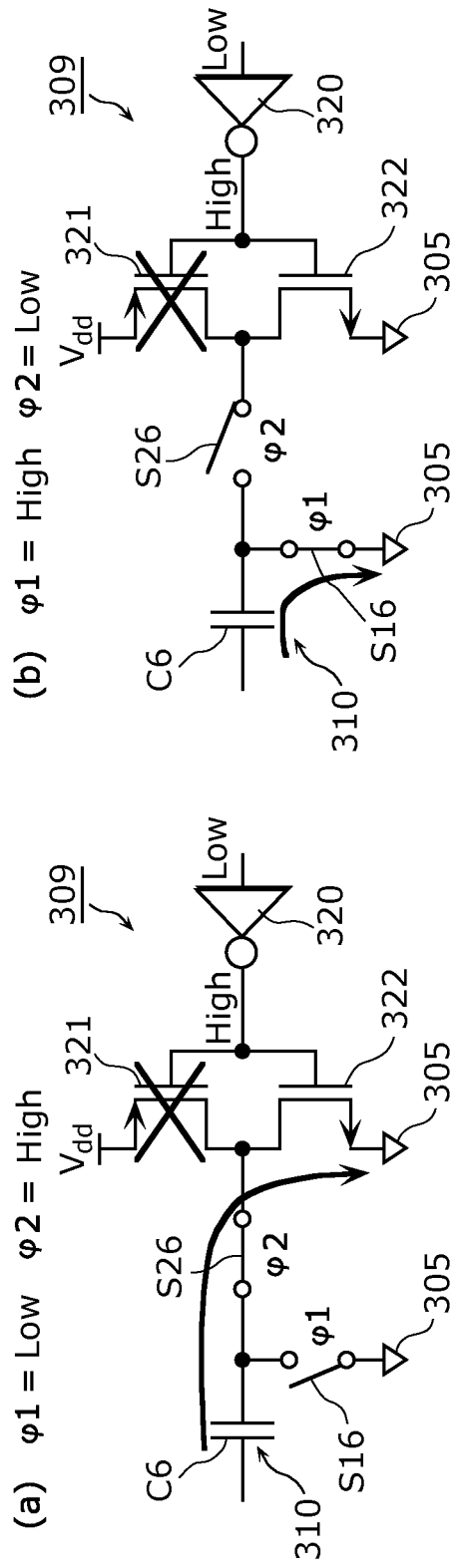
FIG. 15 shows diagrams for explaining a dissipation current of the 1-bit D/A converter when the output digital value is low.

FIG. 15 shows diagrams for explaining a dissipation current of the 1-bit D/A converter 309 when the output digital value $D_{out}$ is low. In the same manner as FIG. 14, FIG. 15 also explains the 1-bit D/A converter 309 as an equivalent circuit.

When the clock signal φ1 is low (the clock signal φ2 is high), the connection relationship is as seen in (a) of FIG. 15. More specifically, in the connection relationship, the switch S16 is OFF, the switch S26 is ON, the PMOS transistor 321 is OFF, and the NMOS transistor 322 is ON. In this state, the electrical charges in the capacitor C6 flow into the first power source 305 via the NMOS transistor 322.

On the other hand, when the clock signal φ1 is high (the clock signal φ2 is low), the connection relationship is as seen in (b) of FIG. 15. More specifically, in the connection relationship, the switch S16 is ON, the switch S26 is OFF, the PMOS transistor 321 is OFF, and the NMOS transistor 322 is ON. In this state, the electrical charges in the capacitor C6 flow into the first power source 305 via the switch S16.

Here, when the output digital value $D_{out}$ is low, one end of the capacitor C6 is kept being connected to the first power source 305. Therefore, when the output digital value $D_{out}$ is low, electrical charges are not charged in the capacitor C6, and eventually no current is provided to the first power source 305.

As described above, the dissipation current of the 1-bit D/A converter 309 occurs when the output digital value $D_{out}$ is high. The dissipation current in this case will be described in more detail.

Figure 16:
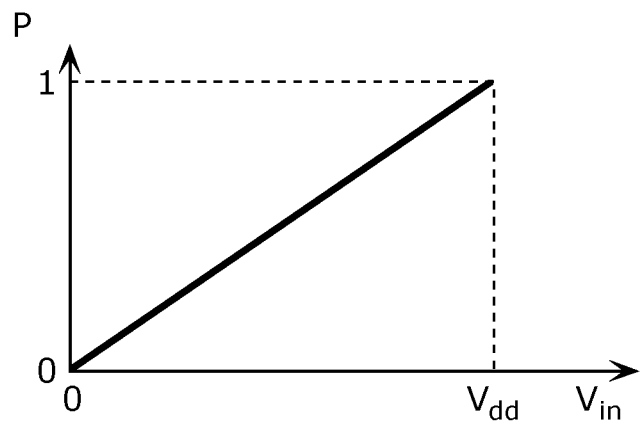
FIG. 16 is a graph plotting a relationship between an input voltage and a probability of a high output digital value.

FIG. 16 is a graph plotting a relationship between an input voltage $V_{in}$ and a probability P of a high output digital value $D_{out}$.

First, as seen in FIG. 13, an output digital value $D_{out}$ and an input voltage $V_{in}$ has a relationship in which a duration of the high output digital value $D_{out}$ is longer as the input voltage $V_{in}$ is higher. Therefore, as seen in FIG. 16, the probability P of a high output digital value $D_{out}$ is increased in proportion to a value of the input voltage $V_{in}$. More specifically, by using a power source voltage $V_{dd}$, the relationship is expressed as $P=V_{in}/V_{dd}$.

Here, if a capacitance value of the capacitor C6 is expressed as C, electrical charges, which flow into the first power source 305 when an output digital value $D_{out}$ is high, is $CV_{dd}$ [C]. Therefore, a dissipation current $I_{AVSS}$ in this case is expressed as $CV_{dd} \cdot P \cdot f$. Here, f denotes a frequency of a clock signal.

Since $P=V_{in}/V_{dd}$ as described above, eventually, $I_{AVSS}=CV_{in} \cdot f$ [A].

Figure 17:
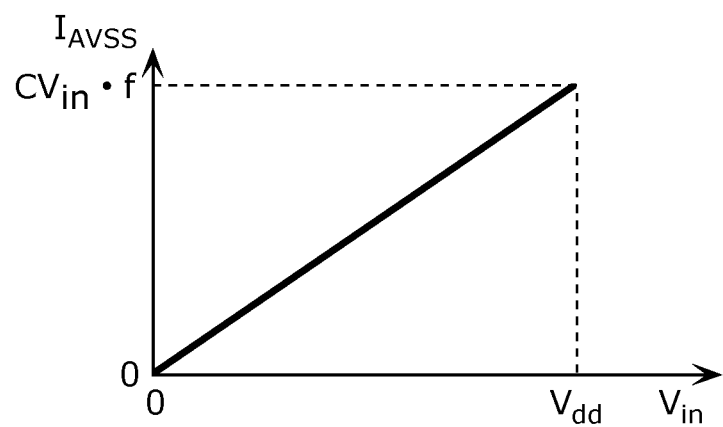
FIG. 17 is a graph plotting a relationship between an input voltage and a dissipation current of the 1-bit D/A converter.

FIG. 17 is a graph plotting a relationship between an input voltage $V_{in}$ and a dissipation current $I_{AVSS}$.

As seen in FIG. 17, the dissipation current $I_{AVSS}$ of the 1-bit D/A converter 309 is proportional to the input voltage $V_{in}$ in the same manner as the dissipation current of the block 351.

Finally, a dissipation current of the block 355 will be described. One end of the capacitor C1 is connected to the input terminal 303 via the switch S11, and the other end of the capacitor C1 is virtually grounded via the inverting amplifier N1. Therefore, in the same manner as described for the block 351, electrical charges proportional to the input voltage $V_{in}$ are charged in the capacitor C1 every time the clock signal φ1 is high, and a dissipation current flowing from the capacitor C1 to the first power source 305 is proportional to the input voltage $V_{in}$ as seen in (a) of FIG. 12.

The counteracting current generation circuit 302 in the A/D converter 300 generates a counteracting current (second current) for counteracting the above-described dependence of a dissipation current (first current) on an input voltage $V_{in}$.

Figure 18:
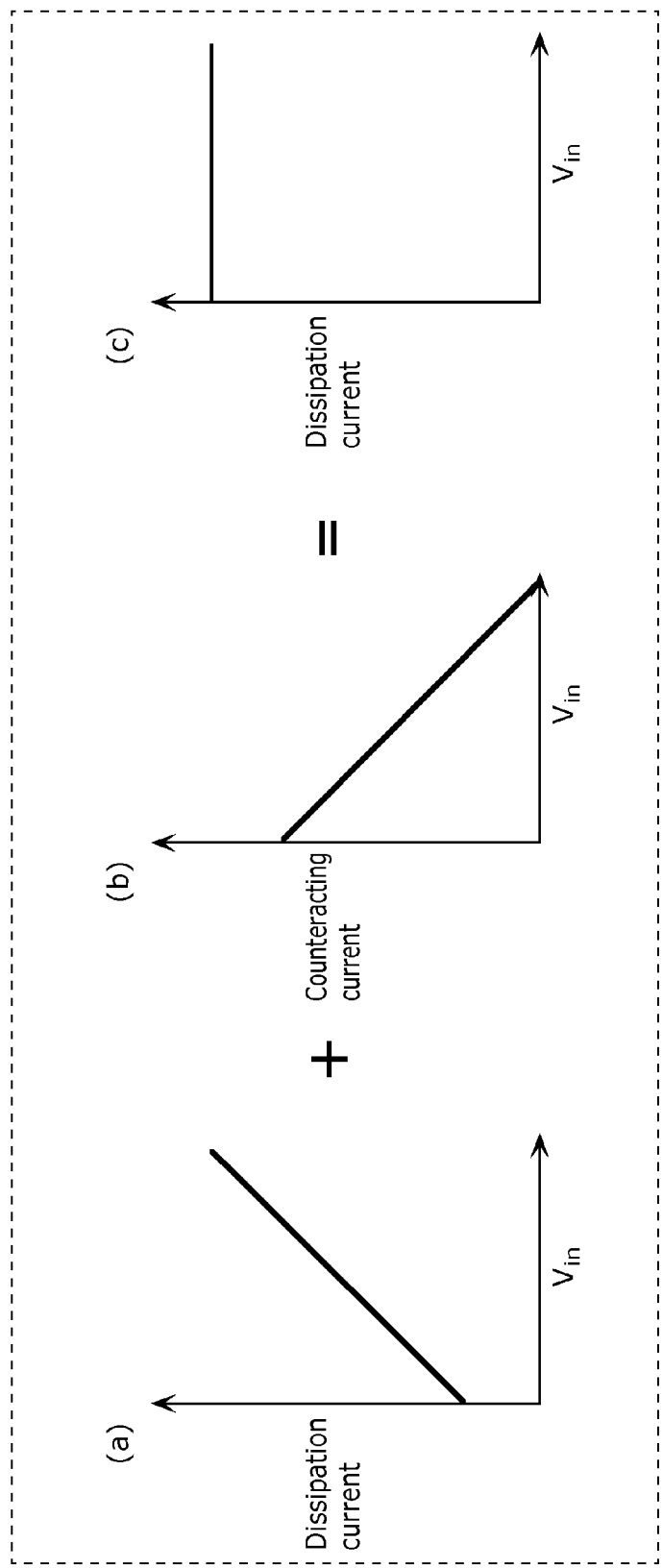
FIG. 18 shows graphs for explaining a counteracting current of a counteracting current generation circuit.

FIG. 18 shows graphs for explaining a counteracting current generated by the counteracting current generation circuit 302.

If all the above-described dissipation currents of the blocks 351, 352, 354, and 355 are added together, an input voltage $V_{in}$ for the entire A/D converter circuit 301 and the resulting dissipation current depending on the input voltage $V_{in}$ have properties expressed as a simple line as seen in (a) of FIG. 18.

As seen in (b) of FIG. 18, properties of the counteracting current generated by the counteracting current generation circuit 302 with respect to the input voltage $V_{in}$ may be opposite to the properties seen in (a) of FIG. 18. More specifically, if the dissipation current depending on the input voltage $V_{in}$ for the entire A/D converter circuit 301 is larger as the input voltage $V_{in}$ is higher, the counteracting current generation circuit 302 may generate a counteracting current to be smaller as the input voltage is higher.

As a result, as seen in (c) of FIG. 18, dependence of a dissipation current of the A/D converter 300 on the input voltage $V_{in}$ is reduced, and a total amount of the dissipation current of the A/D converter 300 and the counteracting current is substantially invariant to the input voltage $V_{in}$.

As illustrated in FIG. 9, a circuit structure of a 1-bit D/A converter 312 in the counteracting current generation circuit 302 is essentially the same as the circuit structure of the 1-bit D/A converter 309. However, the circuit structure of the 1-bit D/A converter 312 differs from the circuit structure of the 1-bit D/A converter 309 in that the inverting amplifier N3 causes the 1-bit D/A converter 312 in the counteracting current generation circuit 302 to receive an inversed signal of an output digital value. Therefore, the counteracting current of the 1-bit D/A converter 312 occurs when an output digital value $D_{out}$ is low, which is opposite to the case of the dissipation current of the 1-bit D/A converter 309.

Furthermore, a capacitance value of the capacitor C7 in the counteracting current generation circuit 302 is substantially equal to a sum of the capacitance values of the capacitors C1, C2, and C6.

Figure 19:
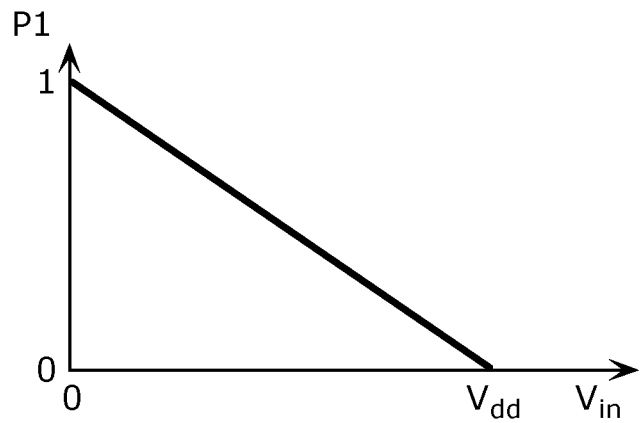
FIG. 19 is a graph plotting a relationship between an input voltage and a probability of a low output digital value.

FIG. 19 is a graph plotting a relationship between an input voltage $V_{in}$ and a probability P' of a low output digital value $D_{out}$.

As seen in FIG. 13, the output digital value $D_{out}$ and the input voltage $V_{in}$ have a relationship in which a duration of the low output digital value $D_{out}$ is shorter as the input voltage $V_{in}$ is higher. Therefore, as seen in FIG. 19, the probability P' of a low output digital value $D_{out}$ is decreased in proportion to a value of the input voltage $V_{in}$. More specifically, as seen in FIG. 19, by using a power source voltage $V_{dd}$, the relationship is expressed as $P'=1-V_{in}/V_{dd}$.

Figure 20:
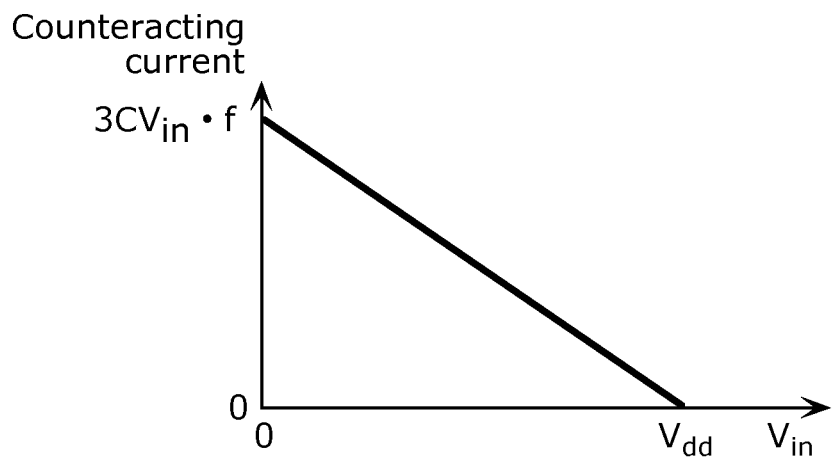
FIG. 20 is a graph plotting a relationship between an input voltage and a counteracting current.

FIG. 20 is a graph plotting a relationship between the input voltage $V_{in}$ and the counteracting current.

If each capacitance value of the capacitors C1, C2, and C6 is C, a capacitance value of the capacitor C7 in the counteracting current generation circuit 302 is 3C. A counteracting current, which flows into the first power source 305 while the output digital value $D_{out}$ is low, is $3CV_{dd} \cdot P1 \cdot f$. Here, since $P1=1-V_{in}/V_{dd}$, the counteracting current is expressed as $-3CV_{in} \cdot f + 3CV_{dd} \cdot f$ [A] and has linear properties as seen in FIG. 20.

Therefore, the counteracting current generation circuit 302 is capable of generating a counteracting current having properties as seen in (b) of FIG. 18, and thereby reducing the dependence of the dissipation currents of the blocks 351, 352, 354, and 355 on the input voltage $V_{in}$ seen in (a) of FIG. 18. Here, as seen in (c) of FIG. 18, the dissipation current of the A/D converter 300 has, in theory, properties that are invariant to the input voltage $V_{in}$.

Although it has been described that the switch S17 is turned ON/OFF according to the clock signal φ1 and the switch S27 is turned ON/OFF according to the clock signal φ2, it is also possible that the switch S17 is turned ON/OFF according to the clock signal φ2 and the switch S27 is turned ON/OFF according to the clock signal φ1.

Figure 21:
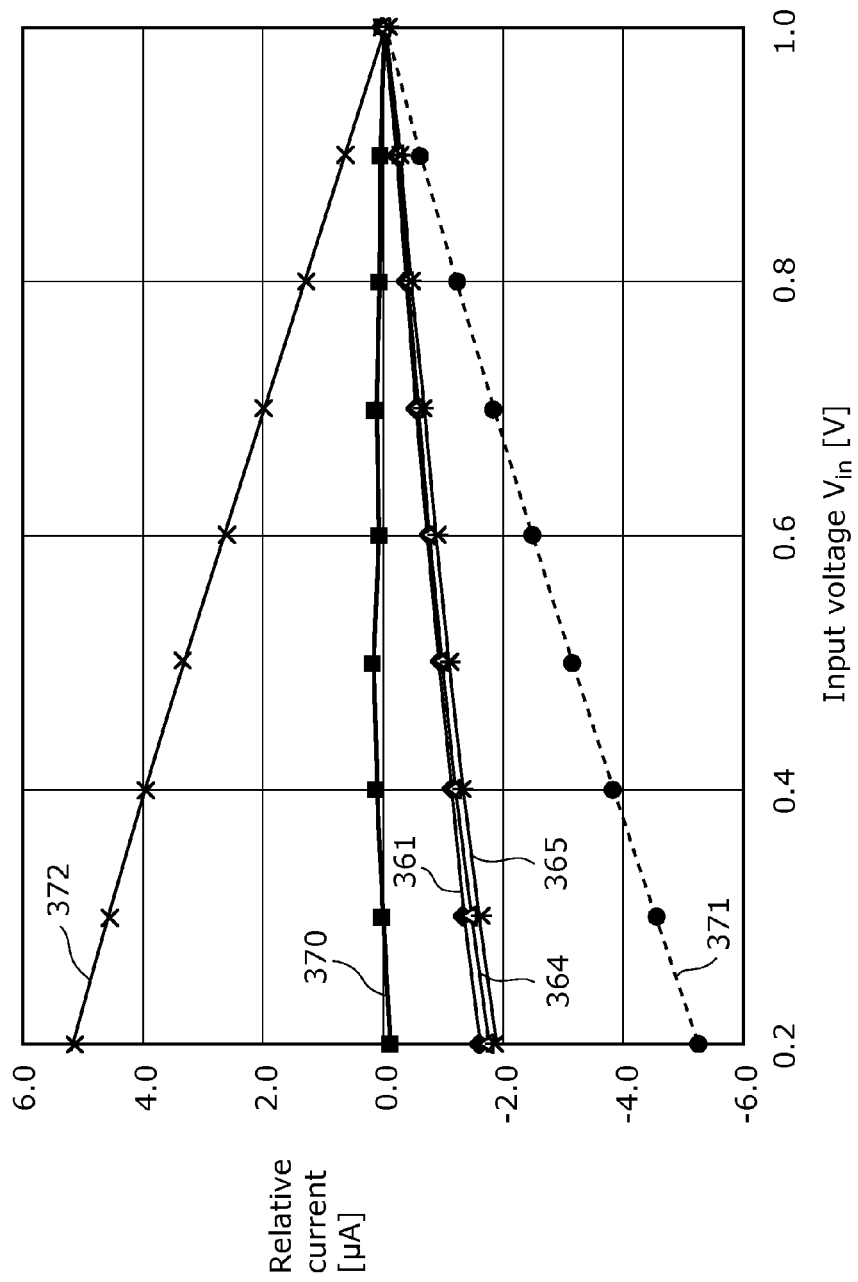
FIG. 21 is a graph plotting a result of simulating dependence of a dissipation current of an A/D converter on an input voltage according to the first embodiment.

FIG. 21 is a graph plotting a result of simulating dependence of a dissipation current of the A/D converter 300 on an input voltage.

Each of lines in the graph of FIG. 21 expresses relative current with reference to a dissipation current in the case where an input voltage is 1.0 [V].

A line 361 expresses a dissipation current of the block 351, a line 364 expresses a dissipation current of the block 354, and a line 365 expresses a dissipation current of the block 355.

A line 371 expresses a sum of the dissipation currents of the blocks 351, 354, and 355, and a line 372 expresses a counteracting current generated by the counteracting current generation circuit 302.

A line 370 expresses a dissipation current of the A/D converter 300, that is, a sum of the dissipation currents of the blocks 351, 354, and 355 and the counteracting current.

If the counteracting current generation circuit 302 is not provided, as seen as the line 371, an absolute value of a relative error is 5.26 [μA] at maximum when the input voltage is 0.2 [V]. In contrast, as a result of generating by the counteracting current generation circuit 302 a counteracting current having properties seen as the line 372, an absolute value of a relative error is 0.11 [μA] at maximum when the input voltage is 0.5 [V] as seen as the line 370. In other words, the relative error is significantly reduced to one forty-seventh or less.

Although it has been described in the first embodiment that the capacitance value of the capacitor C7 is 3C, the present invention is not limited to this. For example, even if the capacitance value of the capacitor C7 is 3C or smaller, for example, C that is equal to the capacitance value of each of the capacitors C1, C2, and C6, counteracting effects are produced at some extent. Alternately, the capacitance value of the capacitor C7 may be 3C or greater.

Second Embodiment

Although it has been described in the first embodiment that the A/D converter 300 includes as the A/D converter circuit a feed forward (FF) second-order ΔΣAD converter circuit, the A/D converter circuit applicable to the present invention is not limited to an FF second-order ΔΣAD converter circuit. The following describes as an another example an A/D converter 400 that includes a feedback (FB) second-order ΔΣAD converter circuit.

Figure 22:
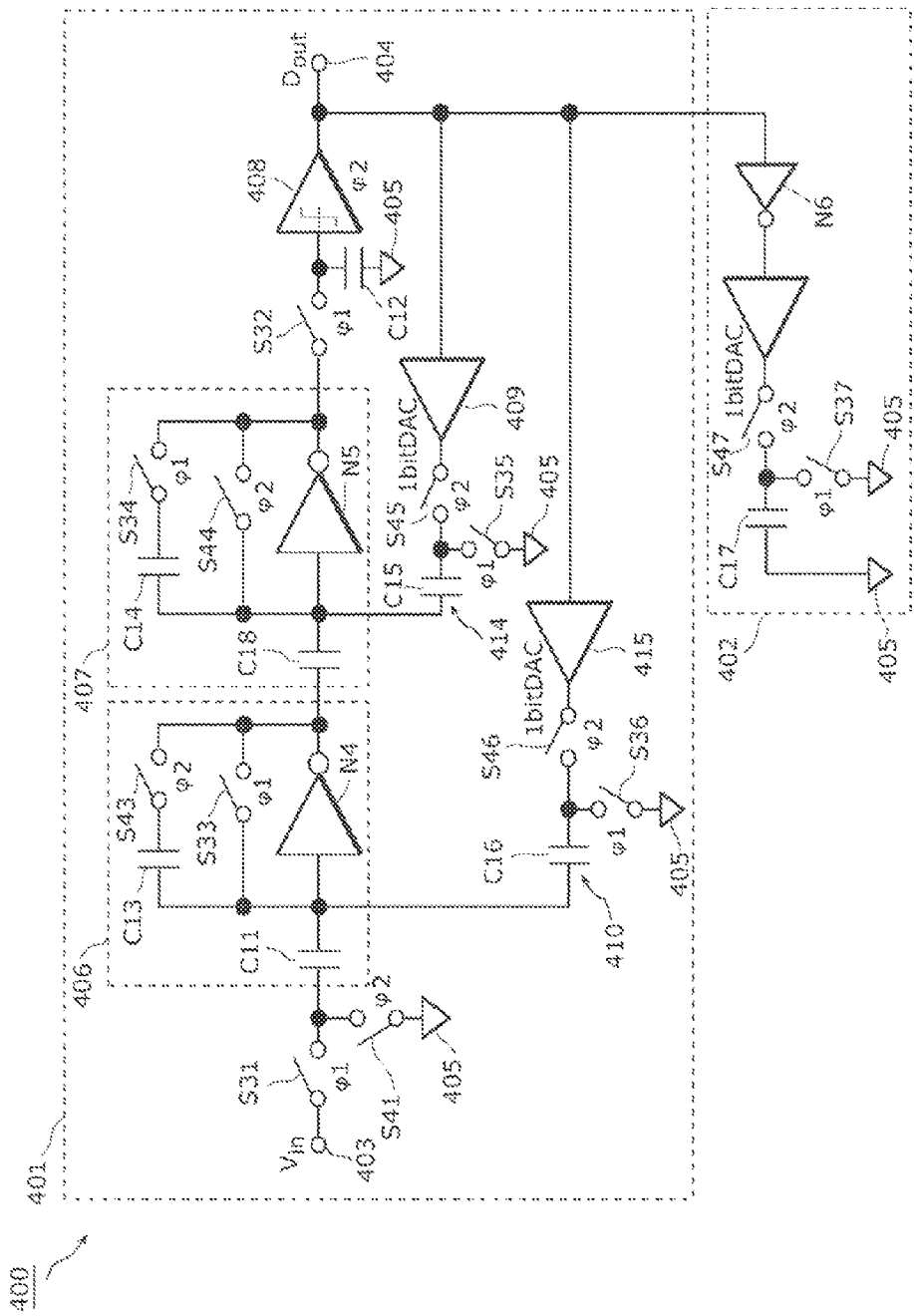
FIG. 22 is a circuit diagram illustrating an A/D converter according to a second embodiment.

FIG. 22 is a circuit diagram of the A/D converter 400.

FIG. 23 is a block diagram illustrating a circuit structure of the A/D converter 400.

The A/D converter 400 includes an A/D converter circuit 401 and a counteracting current generation circuit 402. The A/D converter circuit 401 is an FB second-order ΔΣAD converter circuit that operates in synchronization with the clock signal ϕ1 and the clock signal ϕ2. It should be noted that the clock signal ϕ1 and the clock signal ϕ2 have a mutually complementary relationship in the same manner as described in the first embodiment.

The A/D converter circuit 401 includes a first integrator 406, a second integrator 407, a comparator 408, 1-bit D/A converters 409 and 415, subtractors 410 and 414, a first power source 405, an input terminal 403, and an output terminal 404. In other words, the A/D converter circuit 401 includes inverting amplifiers N4 to N6, switches S31 to S37, switches S41 and S43 to S47, and capacitors C11 to C18.

The subtractor 410 subtracts an output signal of the 1-bit D/A converter 415 from an input voltage $V_{in}$ to output a resulting signal.

The first integrator 406 integrates the output signal of the subtractor 410 to output a resulting signal.

The subtractor 414 subtracts the output signal of the 1-bit D/A converter 409 from the output signal of the first integrator 406 to output a resulting signal.

The second integrator 407 integrates the output signal of the subtractor 414.

The comparator 408 compares the output signal of the second integrator 407 to a predetermined threshold voltage to generate an output digital value $D_{out}$.

Each of the 1-bit D/A converters 409 and 415 outputs a reference voltage according to the output digital value $D_{out}$.

Each of the switches S31 to S37 is turned ON/OFF according to the clock signal ϕ1. Each of the switches S41 and S43 to S47 is turned ON/OFF according to the clock signal ϕ2. For example, these switches are turned ON when the supplied clock signal is high, and turned OFF when the supplied clock signal is low. However, it is also possible that these switches are turned ON when the supplied clock signal is low, and turned OFF when the supplied clock signal is high.

Although FIG. 23 illustrates also a second power source 413, the second power source 413 may be eliminated when the second power source 413 and the first power source 405 are equivalent to each other. In other words, if the second power source 413 is eliminated, the subtractor 410 may subtract an output of the 1-bit D/A converter 415 not an output of the second power source 413 from an input voltage $V_{in}$.

It should be noted that detailed explanation of the circuit operations of the A/D converter circuit 401 are not given herein.

Figure 24:
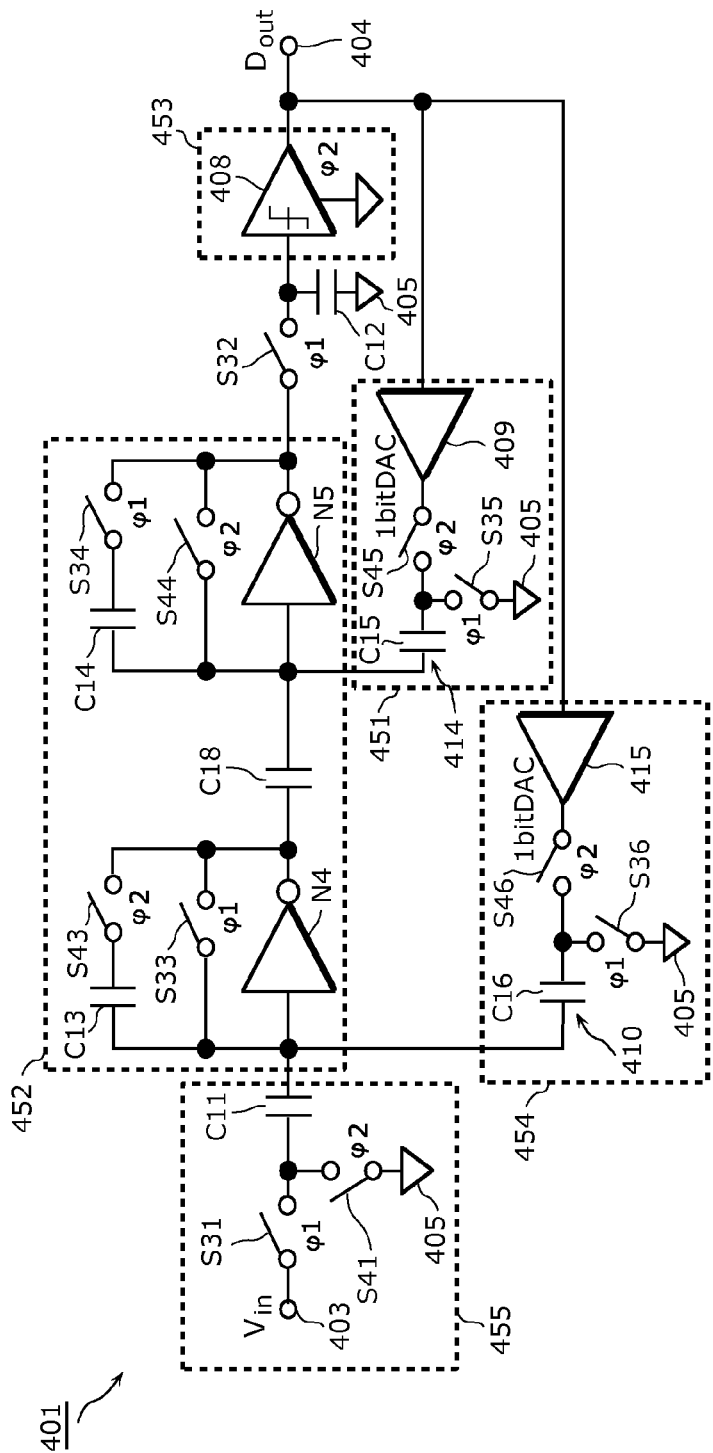
FIG. 24 is a diagram for explaining a dissipation current of an A/D converter circuit according to the second embodiment.

FIG. 24 is a diagram for explaining a dissipation current of the A/D converter circuit 401.

The following describes a path of a dissipation current of the A/D converter circuit 401 which flows to the first power source 405 (GND), for each of five blocks as illustrated in FIG. 24. More specifically, the five blocks are a block 451, a block 452, a block 453, a block 454, and a block 455 which are illustrated in FIG. 24.

A dissipation current of the block 452 is independent from an input voltage $V_{in}$ as seen in (b) of FIG. 12 in the same manner as the dissipation current of the block 352 in the first embodiment.

A dissipation current of the block 453 has properties seen as the convex in (c) of FIG. 12 in the same manner as the dissipation current of the block 353 in the first embodiment. However, since the circuit of the block 453 includes digital elements, if the GND for the circuit is separated from the GNDs (first power sources) for the other circuits, it is not necessary to consider the dissipation current of the block 453 in the operation of the counteracting current generation circuit 402.

A dissipation current of each of the blocks 451 and 454 is proportional to the input voltage $V_{in}$ as seen in (a) of FIG. 12 in the same manner as the dissipation current of the block 354 in the first embodiment.

A dissipation current of the block 455 is proportional to the input voltage $V_{in}$ as seen in (a) of FIG. 12 in the same manner as the dissipation current of the block 355 in the first embodiment.

If all the dissipation currents of the above-described blocks 451, 452, 454, and 455 are added together, an input voltage $V_{in}$ for the entire A/D converter circuit 401 and the resulting dissipation current depending on the input voltage $V_{in}$ have properties expressed as the simple line as seen in (a) of FIG. 18.

As illustrated in FIG. 22, the circuit structure of the counteracting current generation circuit 402 is the same as the circuit structure of the counteracting current generation circuit 302 described in the first embodiment. The counteracting current generation circuit 402 differs from the counteracting current generation circuit 302 in that a capacitance value of the capacitor C17 is a sum of capacitance values of the capacitors C11, C15, and C16. Here, the capacitance value of the capacitor C17 is 4C, if the capacitance value of the capacitor C11 is C, the capacitance value of the capacitor C15 is 2C, and the capacitance value of the capacitor C16 is C.

As a result, the counteracting current generation circuit 402 is capable of reducing the dependence of the dissipation current of the A/D converter circuit 401 on the input voltage $V_{in}$. Here, as seen in (c) of FIG. 18, the dissipation current of the A/D converter 400 has, in theory, properties invariant to the input voltage $V_{in}$.

Figure 25:
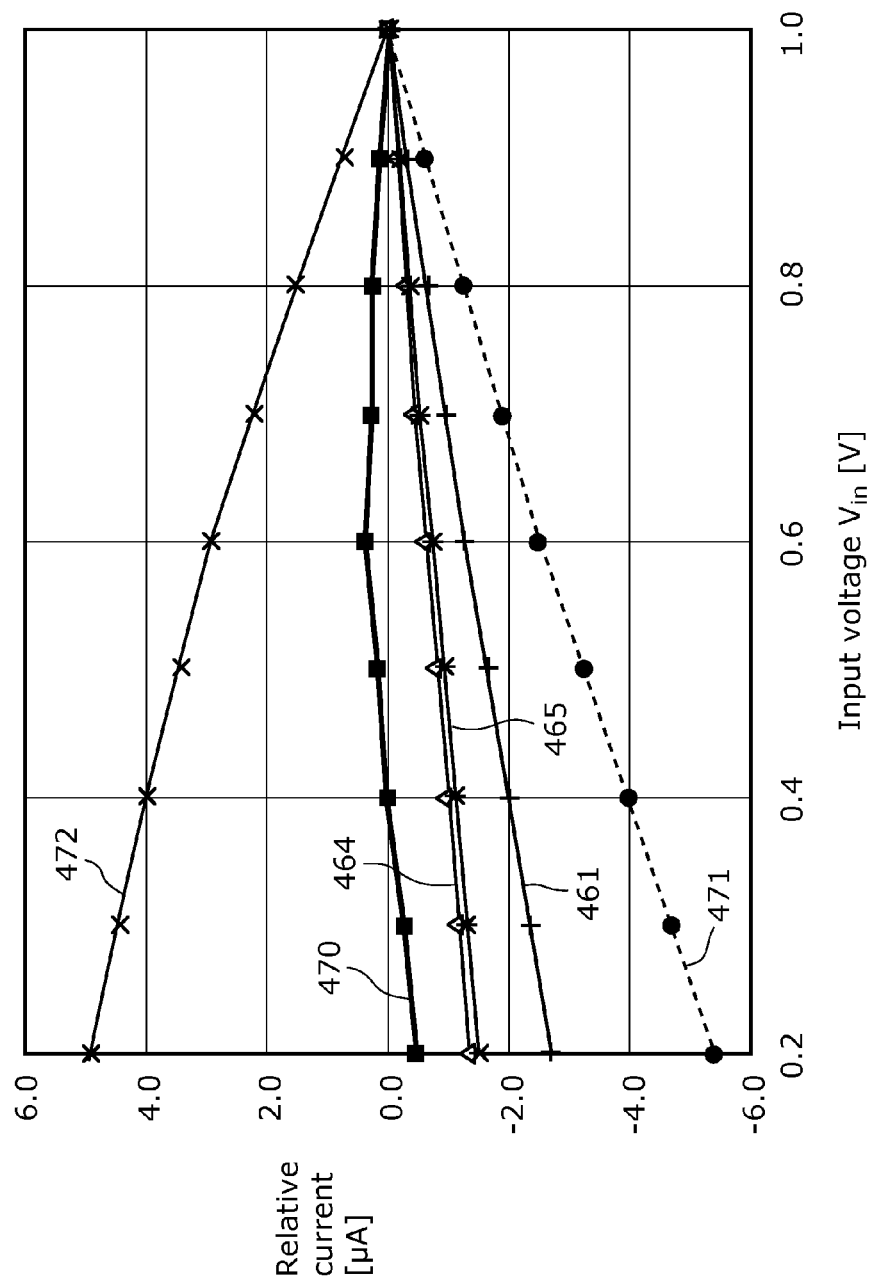
FIG. 25 is a graph plotting a result of simulating dependence of a dissipation current of the A/D converter on an input voltage according to the second embodiment.

FIG. 25 is a graph plotting a result of simulating dependence of a dissipation current of the A/D converter 400 on an input voltage.

Each of lines in the graph of FIG. 25 expresses relative current with reference to a dissipation current in the case where an input voltage is 1.0 [V].

A line 461 expresses a dissipation current of the block 451, a line 464 expresses a dissipation current of the block 454, and a line 465 expresses a dissipation current of the block 455.

A line 471 expresses a sum of the dissipation currents of the blocks 451, 454, and 455, and a line 472 expresses a counteracting current generated by the counteracting current generation circuit 402.

A line 470 expresses a dissipation current of the A/D converter 400, that is, a sum of the dissipation currents of the blocks 451, 454, and 455 and the counteracting current.

If the counteracting current generation circuit 402 is not provided, as seen as the line 471, an absolute value of a relative error is 5.39 [μA] at maximum when the input voltage is 0.2 [V]. In contrast, as a result of generating by the counteracting current generation circuit 402 the counteracting current having properties as seen as the line 472, an absolute value of a relative error is 0.35 [μA] at maximum when the input voltage is 0.6 [V] as seen as the line 470. In other words, the relative error is reduced to one fifteenth or less.

Although it has been described in the second embodiment that the capacitance value of the capacitor C17 is 4C, the present invention is not limited to this. For example, even if the capacitance value of the capacitor C17 is 4C or smaller, for example, C that is equal to the capacitance value of each of the capacitors C11 and C16, or 2C that is equal to the capacitance value of the capacitor C15, counteracting effects are produced at some extent. Alternately, the capacitance value of the capacitor C17 may be 4C or greater.

Third Embodiment

In the third embodiment, the description is given for an A/D converter 500 that uses, as an A/D converter circuit, an FF second-order ΔΣAD converter circuit different from that of the first embodiment.

Figure 26:
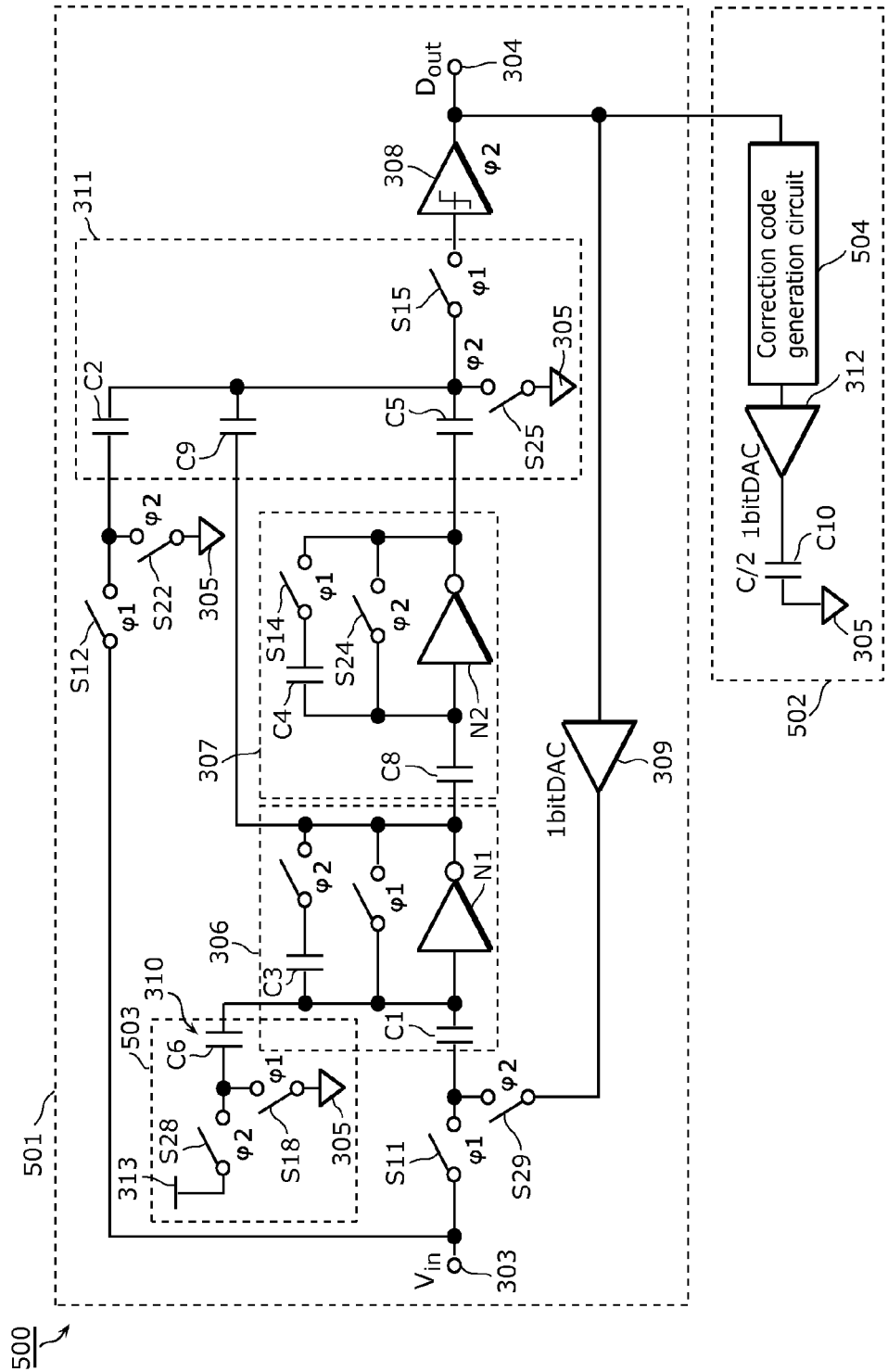
FIG. 26 is a circuit diagram of an A/D converter according to a third embodiment.

FIG. 26 is a circuit diagram of the A/D converter 500.

The A/D converter 500 includes an A/D converter circuit 501 and a counteracting current generation circuit 502.

The A/D converter circuit 501 illustrated in FIG. 26 differs from the A/D converter circuit 301 illustrated in FIG. 9 in that the capacitor C1 serves as an input capacitor of the first integrator 306 and also as a capacitor for sampling an output of the 1-bit D/A converter 309. In other words, the capacitor C1 is used for both the above two uses. Furthermore, the A/D converter circuit 501 differs from the A/D converter circuit 301 also in that an offset circuit 503 is further provided to subtract a voltage of the second power source 313 from an input voltage $V_{in}$. It should be noted that a capacitance value of each of the capacitors C1, C2, and C6 illustrated in FIG. 26 is C [F].

Figure 27:
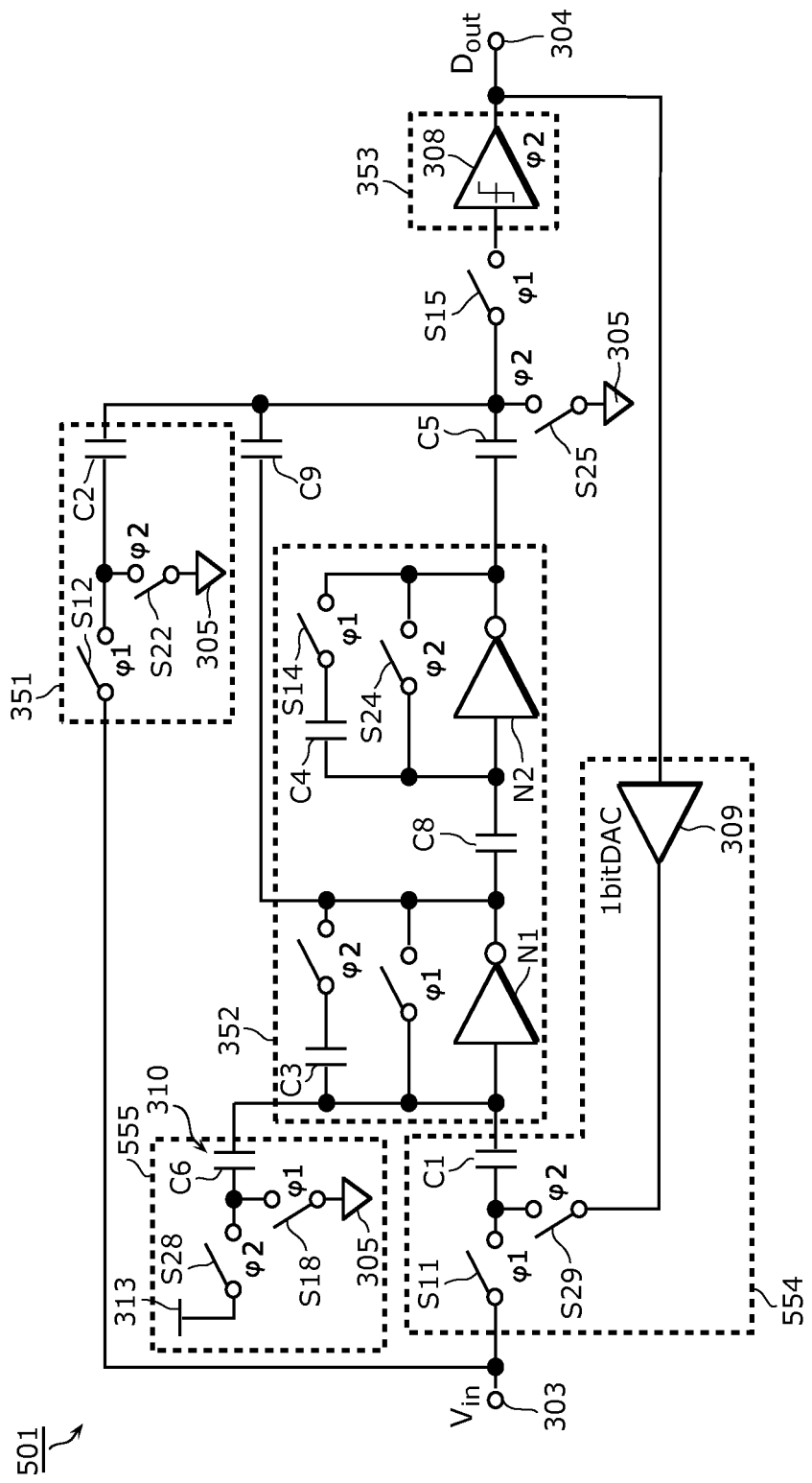
FIG. 27 is a diagram for explaining a dissipation current of an A/D converter circuit according to the third embodiment.

FIG. 27 is a diagram for explaining a dissipation current of the A/D converter circuit 501.

Hereinafter, the dissipation current of the A/D converter circuit 501 is described for each of blocks illustrated in FIG. 27.

A dissipation currents of the block 351, the block 352, and the block 353 are the same as the respective dissipation currents described in the first embodiment. Therefore, these dissipation currents are not explained again below.

In a block 555, a dissipation current of the offset circuit 503 is independent from an input voltage $V_{in}$. This is because, in the offset circuit 503, electrical charges, which are charged in the capacitor C6 by the second power source 313, flow into the first power source 305 via the switch S18.

The following describes the dissipation current of the block 554 in more detail.

Figure 28:
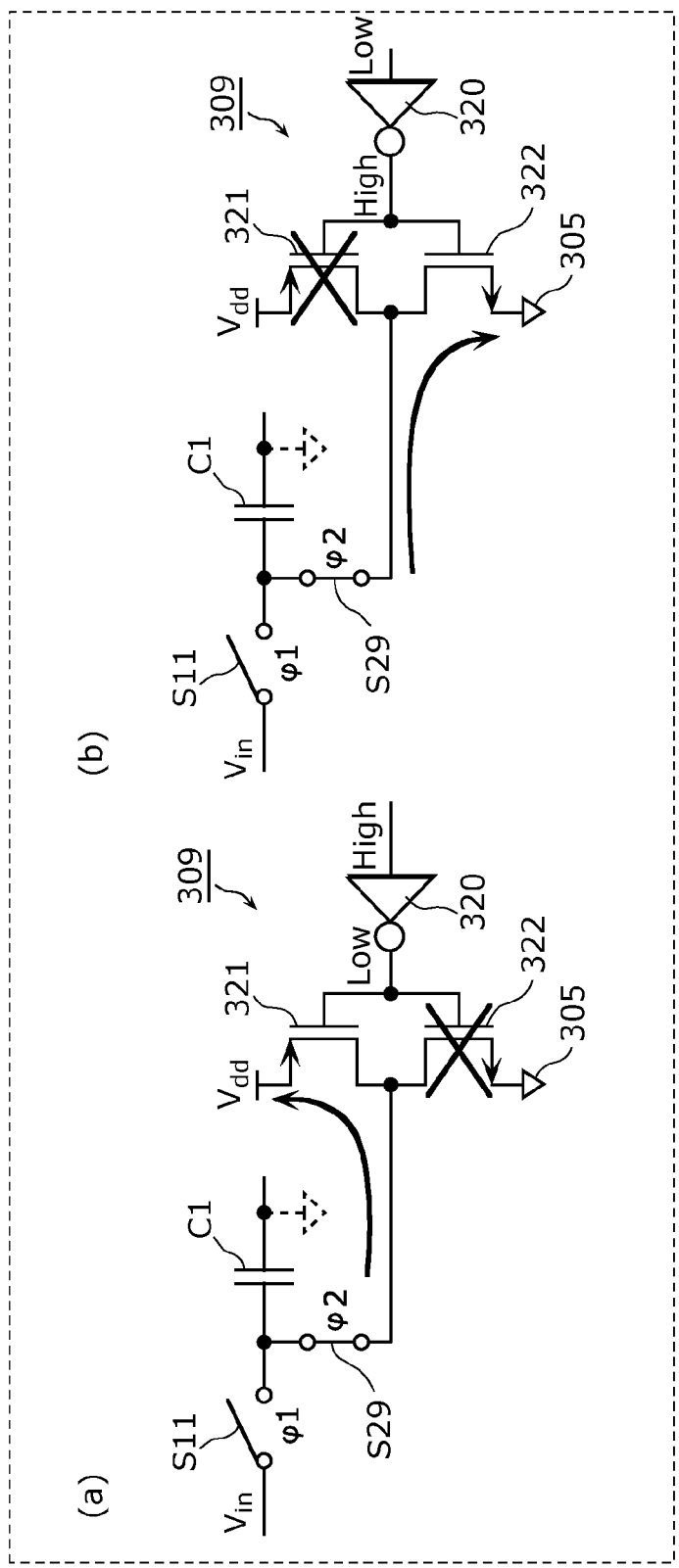
FIG. 28 shows diagrams for explaining a dissipation current of a 1-bit D/A converter in the A/D converter circuit according to the third embodiment.

FIG. 28 is a diagram for explaining a dissipation current of the 1-bit D/A converter 309 in the A/D converter circuit 501.

As seen in (a) of FIG. 28, when an output digital value $D_{out}$ is high, the NMOS transistor 322 which is only one current path to the first power source 305 is OFF. Therefore, no current flows into the first power source 305.

On the other hand, as seen in (b) of FIG. 28, when an output digital value $D_{out}$ is low, the NMOS transistor 322 is ON. Therefore, a current path to the first power source 305 occurs. In other words, in the block 554, a current flowing into the first power source 305 as a dissipation current is to be considered when the switch S29 is changed from OFF to ON.

Here, one end of the capacitor C1 is virtually grounded via the inverting amplifier N1 in the first integrator 306. The other end of the capacitor C1 is connected to the input terminal 303 via the switch S11. Therefore, electrical charges of $C \cdot V_{in}$ [C], which have been charged in the capacitor C1 at the input voltage $V_{in}$ while the clock signal φ1 is high, start flowing into the first power source 305 when the clock signal φ1 is changed from high to low.

Figure 29:
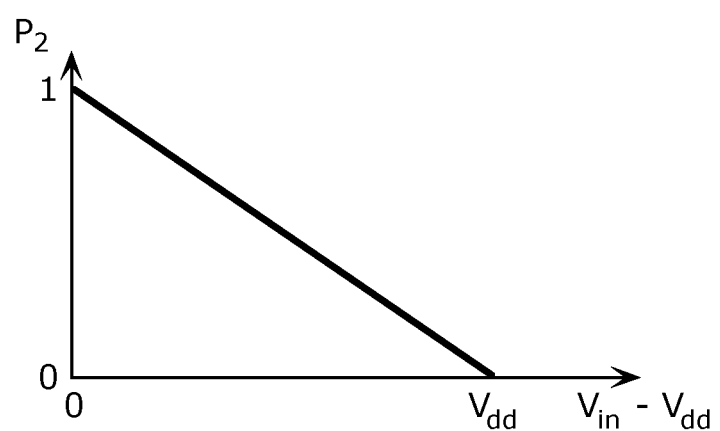
FIG. 29 is a graph plotting a relationship between an input voltage and a probability of a low output digital value.

FIG. 29 is a graph plotting a probability that an output digital value of the 1-bit D/A converter 309 in the A/D converter circuit 501 is low. Here, the horizontal axis in FIG. 29 expresses input voltage $V_{in}$–power source voltage $V_{dd}$.

A probability $P_2$ of a low output digital value is expressed as $P2=-((V_{in}-V_{dd})/V_{in})+1$ as seen in FIG. 29, because an integrator integrates a voltage that is obtained by the offset circuit 503 by subtracting a power source voltage $V_{dd}$ of the second power source 313 from an input voltage $V_{in}$. Therefore, the dissipation current of the 1-bit D/A converter 309 is $I_{AVSS}=f \cdot C(-V_{in}^2/V_{dd} \, 2 \, V_{in})$ [A]. Here, f denotes a frequency of a clock signal.

In this case, if $I_{AVSS}$ is considered as electrical charges ΔQ·P2, the equation expressing ΔQ·P2 can be converted to the following.

$$\Delta QP_2 = -C\frac{V_{in}}{V_{dd}} + 2CV_{in} \qquad \text{[Math. 1]}$$

$$= -\frac{C}{V_{dd}}(V_{in} - V_{dd})(V_{in} - 2V_{dd}) - CV_{in} + 2CV_{dd}$$

$$= \Delta Q'_d + \Delta Q'_c$$

As seen above, $I_{AVSS}$ is expressed by two kinds of electrical charges $\Delta Q_c'$ and $\Delta Q_d'$.

Figure 30:
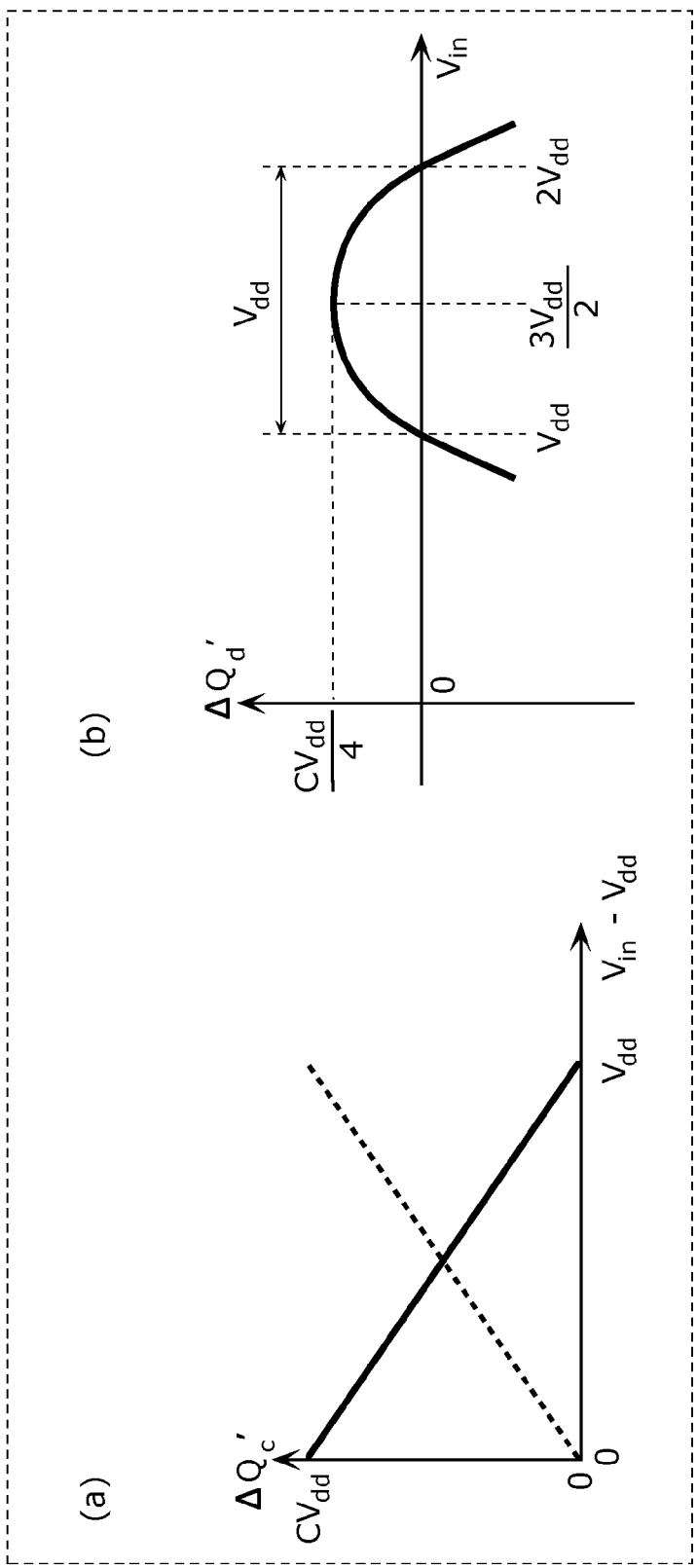
FIG. 30 shows graphs for explaining $\Delta Q_c'$ and $\Delta Q_d'$.

FIG. 30 shows graphs for explaining $\Delta Q_c'$ and $\Delta Q_d'$. Here, the horizontal axis in (a) of FIG. 30 expresses input voltage $V_{in}$–power source voltage $V_{dd}$.

Since $\Delta Q_c'$ is expressed as $\Delta Q_c'=-C \cdot (V_{in}-V_{dd})+C \cdot V_{dd}$, $\Delta Q_c'$ has properties seen as a solid line in (a) of FIG. 30. On the other hand, if the dissipation current (electrical charges) of the block 351 is $\Delta Q_c$, $\Delta Q_c=C \cdot V_{in}$. Therefore, $\Delta Q_c$ expresses properties seen as a broken line in (a) of FIG. 30, having inclination opposite to inclination of $\Delta Q_c'$. As a result, the dependence of $\Delta Q_c$ on an input voltage is counteracted by $\Delta Q_c'$.

Since $\Delta Q_d'=-C \cdot (V_{in}-V_{dd})(V_{in}-2 \, V_{dd})/V_{dd}$, $\Delta Q_d'$ is expressed as a quadric curve as seen in (b) of FIG. 30, and a peak of the quadric curve is $C \cdot V_{dd}/4$ [C]. Here, when $\Delta Q_d'$ has the value at the peak of the quadric curve seen in (b) of FIG. 30, in other words, when $V_{in}-V_{dd}=V_{dd}/2$, an occurrence probability $P_2$ is 0.5 according to FIG. 29, so that the equivalent capacitance of $\Delta Q_d'$ is C/2.

Figure 31:
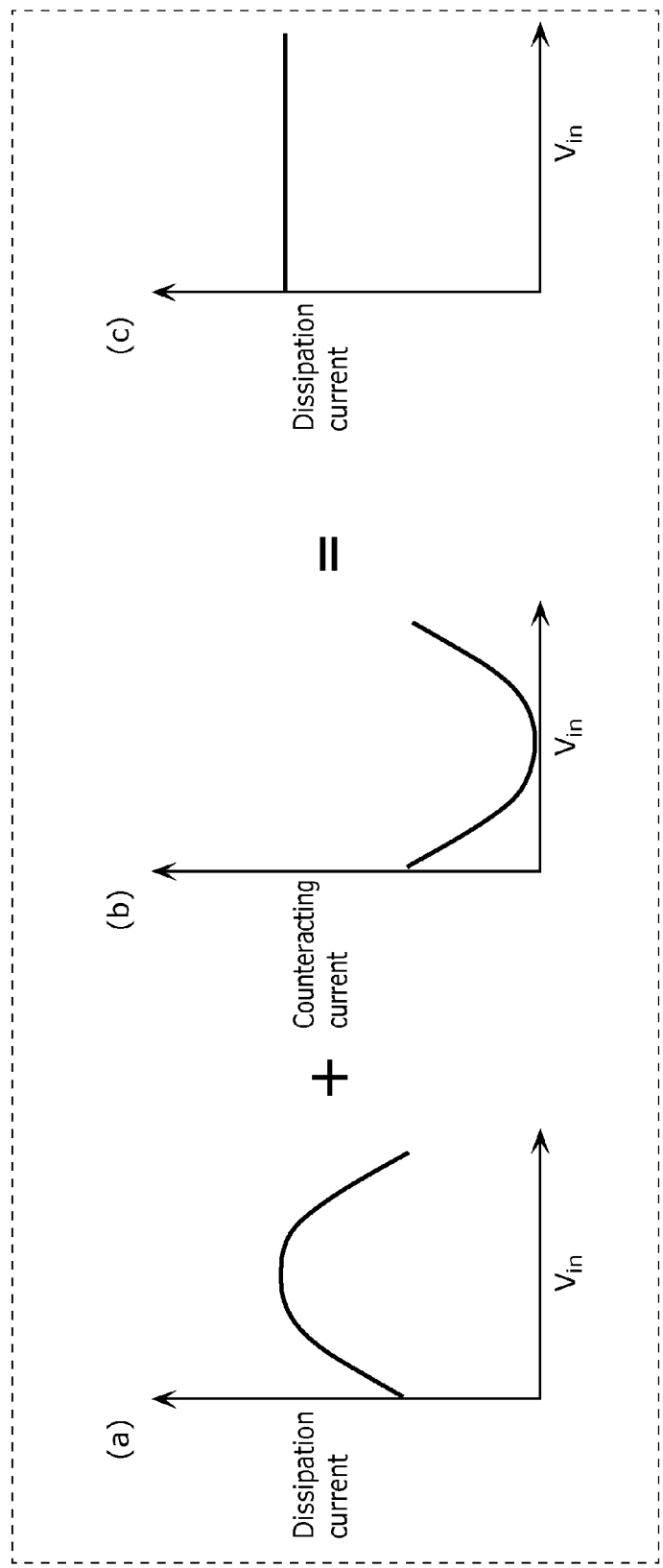
FIG. 31 shows graphs for explaining a counteracting current in a counteracting current generation circuit according to the third embodiment.

As described above, if the dissipation current of the block 351 and the dissipation current of the block 554 are added together, properties of the dissipation current depending on an input voltage $V_{in}$ are as seen in (a) of FIG. 31.

FIG. 31 shows graphs for explaining the counteracting current generated by the counteracting current generation circuit 502.

The counteracting current generation circuit 502 generates a counteracting current having properties as seen in (b) of FIG. 31, and thereby reducing the dependence of the dissipation current of the A/D converter 500 on the input voltage $V_{in}$ as seen in (c) of FIG. 31.

As illustrated in FIG. 26, according to the third embodiment, the counteracting current generation circuit 502 includes a correction code generation circuit 504, a 1-bit D/A converter 312, and the capacitor C10.

Since as described previously the equivalent capacitance of $\Delta Q_d'$ is C/2, a capacitance value of the capacitor C10 is C/2. Furthermore, $\Delta Q_d'$ depends on an output digital value $D_{out}$ inputted to the 1-bit D/A converter 309 to have the above-described properties. Therefore, the correction code generation circuit 504 generates a correction code and provide the correction code to the 1-bit D/A converter 312, thereby generating the counteracting current having the properties as seen in (b) of FIG. 31.

Figure 32:
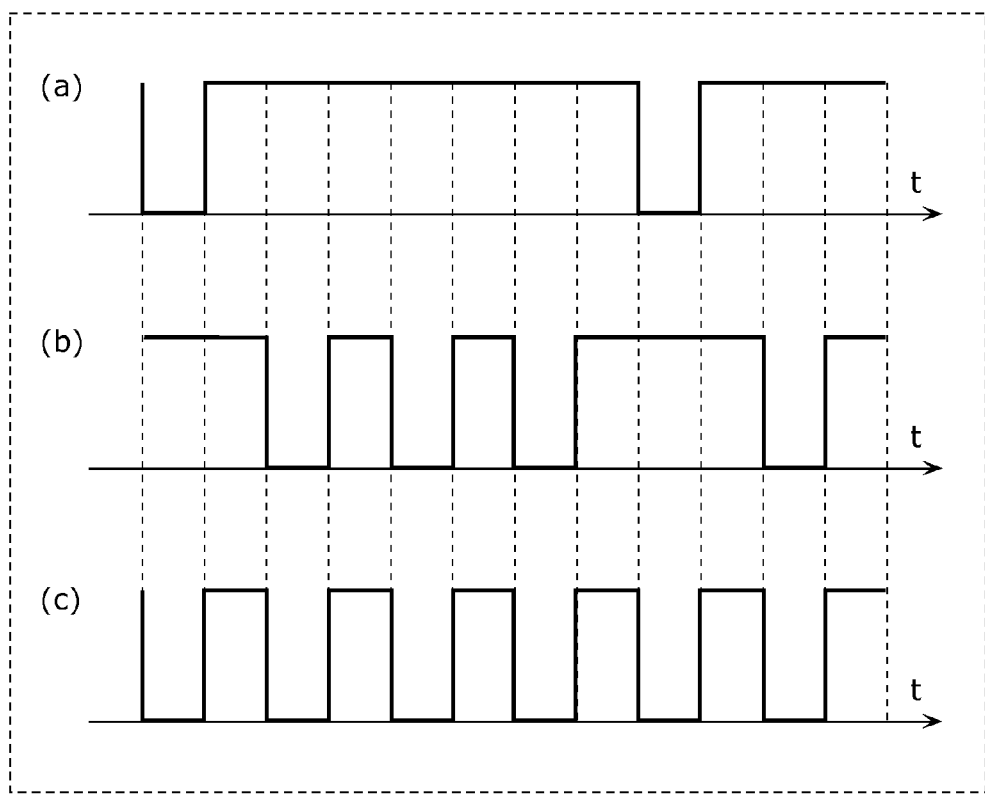
FIG. 32 is a chart for explaining a correction code generated by a correction code generation circuit.

FIG. 32 is a chart for explaining the correction code generated by the correction code generation circuit 504.

If an output digital value $D_{out}$ has a value as seen in (a) of FIG. 32, the correction code generation circuit 504 generates the correction code as seen in (b) of FIG. 32 and provides the correction code to the 1-bit D/A converter 312. In other words, it is possible that the correction code generation circuit 504 generates the correction code that varies only in a period in which the output digital value $D_{out}$ does not vary.

This is because if the output digital value $D_{out}$ and the correction code are synthesized, the resulting synthesized signal does not depend on the output digital value $D_{out}$, as seen in (c) of FIG. 32.

Figure 33:
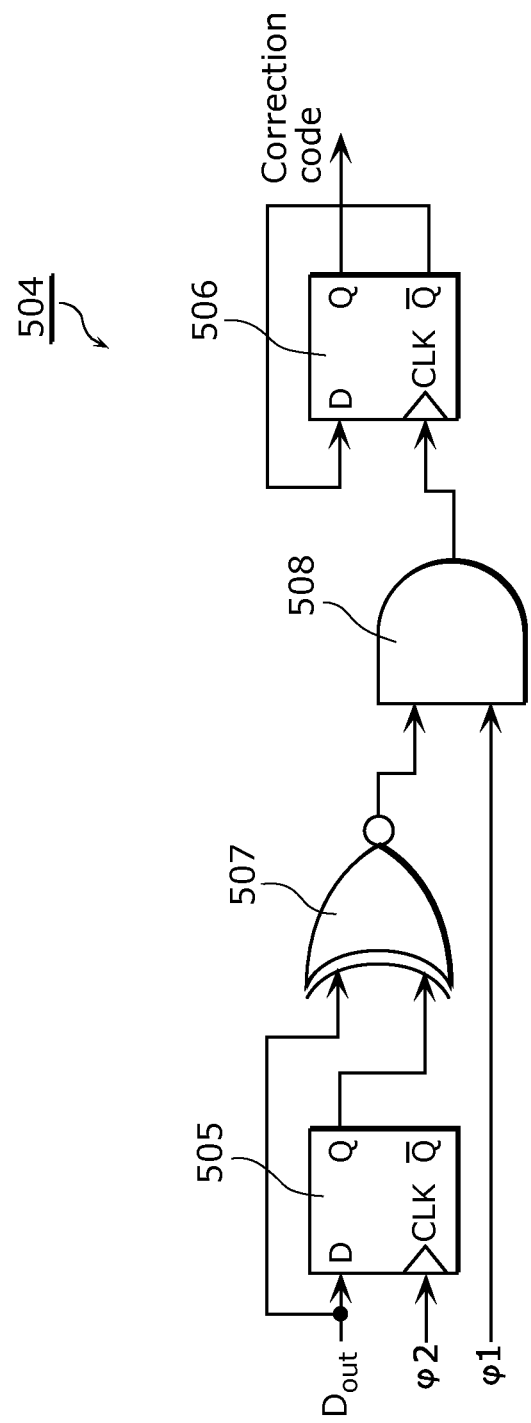
FIG. 33 is a circuit diagram of an example of the correction code generation circuit.

FIG. 33 is a circuit diagram of an example of the correction code generation circuit 504.

The correction code generation circuit 504 includes two DFF circuits 505 and 506, an XNOR circuit 507, and an AND circuit 508.

Figure 34:
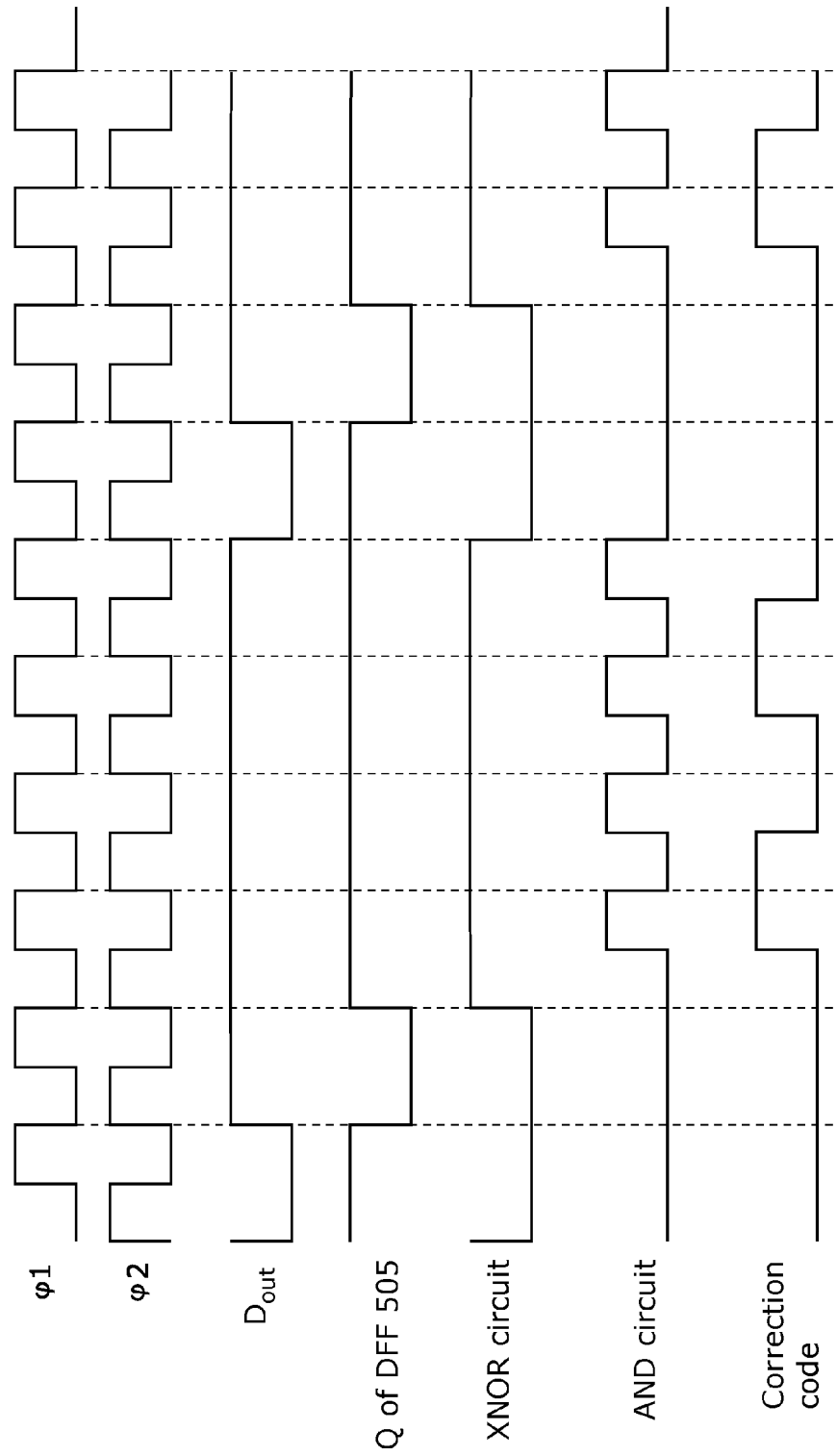
FIG. 34 is a chart illustrating an output waveform of each of the constituent elements in the correction code generation circuit.

FIG. 34 is a chart illustrating an output waveform of each of the constituent elements in the correction code generation circuit 504.

As seen in FIG. 34, the correction code generation circuit 504 is capable of generating a correction code that varies only in a period in which the output digital value $D_{out}$ does not vary. It should be noted that as seen in FIG. 34, outputting of the correction code is delayed by a half cycle of a clock signal from outputting of the output digital value $D_{out}$, but the delay is not a problem.

Figure 35:
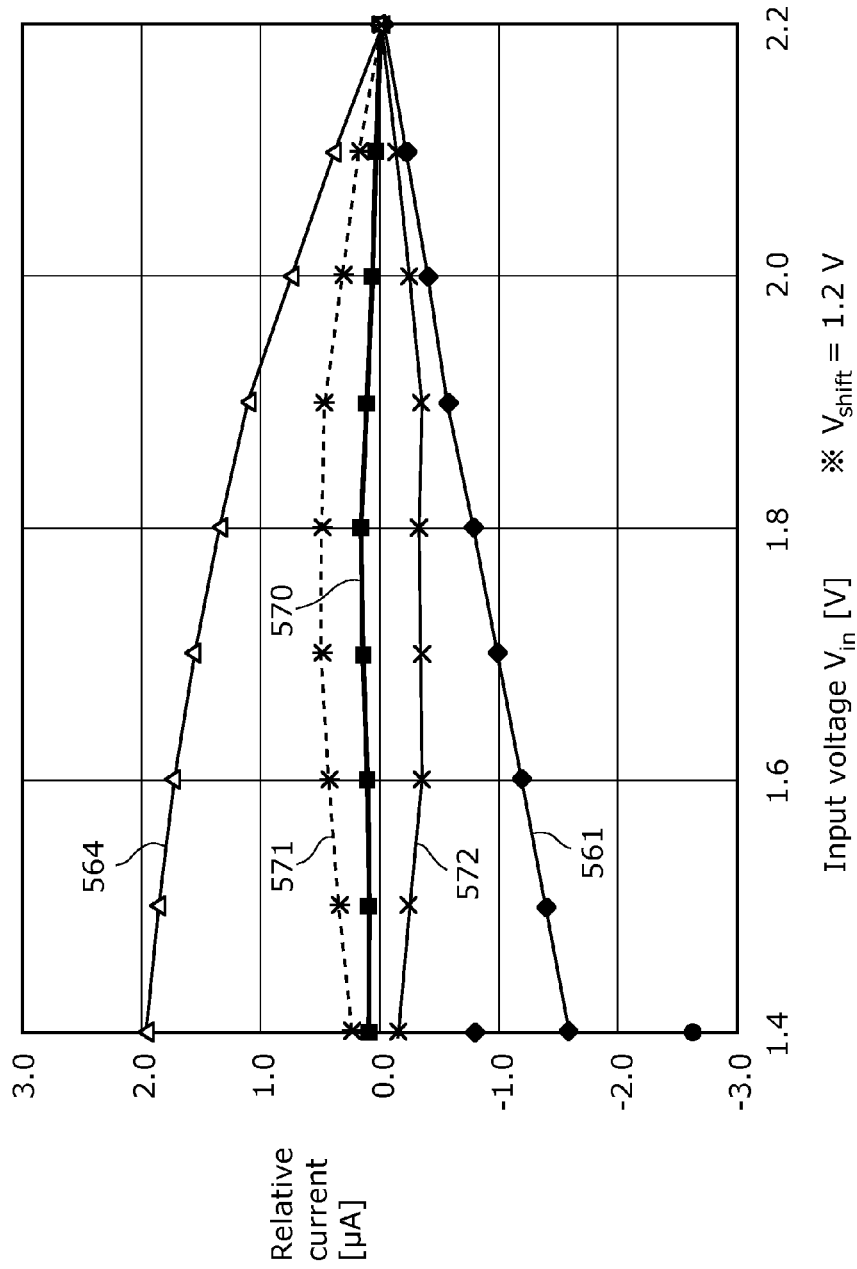
FIG. 35 is a graph plotting a result of simulating dependence of a dissipation current of the A/D converter on an input voltage according to the third embodiment.

FIG. 35 is a graph plotting a result of simulating dependence of a dissipation current of the A/D converter 500 on an input voltage.

Each of lines in the graph of FIG. 35 expresses a relative current with reference to a dissipation current in the case where an power source voltage $V_{dd}$ is 1.2 [V] and an input voltage $V_{in}$ is 2.2 [V].

A line 561 expresses a dissipation current of the block 351, and a line 564 expresses a dissipation current of the block 554.

A line 571 expresses a sum of the dissipation currents of the blocks 351, 352, 353, 554, and 555, and a line 572 expresses the counteracting current generated by the counteracting current generation circuit 502.

A line 570 expresses a dissipation current of the A/D converter 500, that is, a sum of the dissipation currents of the blocks 351, 352, 353, 554, and 555 and the counteracting current.

If the counteracting current generation circuit 502 is not provided, as seen as the line 571, an absolute value of a relative error is 0.49 [μA] at maximum when the input voltage is 1.7 [V]. In contrast, as a result of generating by the counteracting current generation circuit 502 the counteracting current having the properties as seen as the line 572, an absolute value of a relative error is 0.15 [μA] at maximum when the input voltage is 1.8 [V] as seen as the line 570.

Although the counteracting current generation circuit 502 described in the third embodiment is applied to an FF second-order ΔΣAD converter circuit, a circuit having a structure with the same concept may be applied to other A/D converter circuits such as an FF second-order ΔΣAD converter circuit.

(Variations)

Although the A/D converters according to the embodiments have been described above, the present invention is not limited to these embodiments. The following variations are also included in the present invention.

For example, the counteracting current generation circuits 302 and 402 described in the first and second embodiments, respectively, may have a structure as illustrated in FIG. 36.

More specifically, each of the counteracting current generation circuits 302 and 402 may include: the capacitor C7 having one end connected to a fifth power source 509; a switch S61 for controlling electrical connection between an output terminal of the inverting amplifier N7 and the other end of the capacitor C7 according to the clock signal φ2 (or φ1); and a switch S51 for controlling electrical connection between the other end of the capacitor C7 and the first power source 305 according to the clock signal φ1 (or φ2).

Here, the capacitance value of the capacitor C7 is appropriately set to have a value for counteracting the dissipation current of the A/D converter circuit.

Furthermore, the counteracting current generation circuit 502 described in the third embodiment may have a structure as illustrated in FIG. 37.

More specifically, the counteracting current generation circuit 502 may include: the capacitor C10 having one end connected to the fifth power source 509; a switch S62 for controlling electrical connection between an output terminal of the correction code generation circuit 504 and the other end of the capacitor C10 according to the clock signal φ2 (or φ1); and a switch S52 for controlling electrical connection between the other end of the capacitor C10 and the first power source 305 according to the clock signal φ1 (or φ2).

Here, the capacitance value of the capacitor C10 is appropriately set to have a value for counteracting the dissipation current of the A/D converter circuit.

The A/D converter described in any one of the embodiments is provided, in particular, in the image sensor as illustrated in FIG. 1. The provision of the A/D converter according to any one of the embodiments allows to the image sensor to offer high image quality and less streaking phenomenon.

Figure 38:
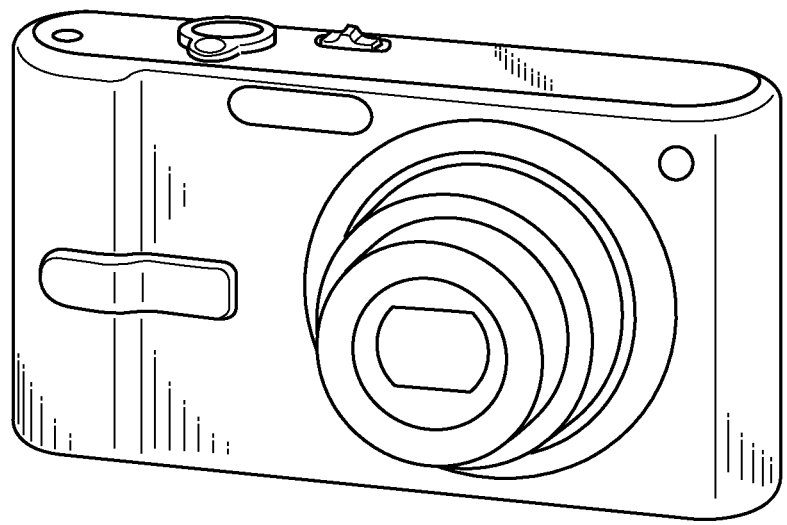
FIG. 38 is an external view of a digital camera.

Furthermore, the image sensor in which the A/D converter according to any one of the embodiments is provided can be used in a digital camera as illustrated in FIG. 38. Therefore, a digital camera with high image quality and less streaking phenomenon can be provided. For example, the above-described digital camera includes a processor, and further includes a lens unit, a CMOS image sensor, the A/D converter according to any one of the embodiments, a memory, and a display which are controlled by the processor.

Furthermore, the A/D converter according to any one of the embodiments may be used in other apparatuses.

Figure 39:
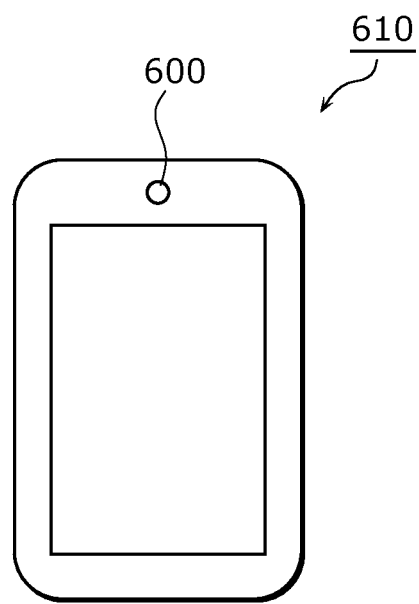
FIG. 39 is an external view of a mobile information terminal device.

For example, as illustrated in FIG. 39, a mobile information terminal device 610 represented by smartphones and tablet terminals includes a CMOS image sensor in a camera part 600. Therefore, the image sensor in which the A/D converter according to any one of the embodiments is provided may be used in the mobile information terminal device 610.

It should be noted that it has been described in the embodiments that a second-order ΔΣA/D converter circuit is an example of the A/D converter circuit, the A/D converter circuit may be a first-order or third-order ΔΣAD converter circuit. Furthermore, the A/D converter circuit may be A/D converter circuits of circuit types other than the ΔΣAD converter circuits. For example, the A/D converter circuit may be a cyclic A/D converter circuit.

It should be noted that the present invention is not limited to these embodiments and variations. Those skilled in the art will be readily appreciated that various modifications of the exemplary embodiments and variations and combinations of the structural elements of the different embodiments and variations are possible without materially departing from the novel teachings and advantages of the present invention. Accordingly, all such modifications and combinations are intended to be included within the scope of the present invention.

INDUSTRIAL APPLICABILITY

The A/D converter according to the present invention has low dependence of a dissipation current on an input voltage, so that the A/D converter provided in an image sensor allows the image sensor to offer high image quality with reduced streaking phenomenon. Furthermore, if the image sensor is provided in a digital camera, the digital camera has higher image quality.

REFERENCE SIGNS LIST 101 image sensor
102 pixel unit
103 row selector
104 column ADC
105 parallel/serial conversion unit
106 peripheral circuit
107 ADC
110, 111 image
121 sampling capacitor
122 capacitor
123 operating amplifier
124, 125, 126, 127 switch
129, 303, 403 input terminal
130, 304, 404 output terminal
200, 300, 400, 500 A/D converter
201, 301, 401, 501 A/D converter circuit
202, 302, 402, 502 counteracting current generation circuit
203 third power source
204 fourth power source
205, 305, 405 first power source
306, 406 first integrator
307, 407 second integrator
308, 408 comparator
309, 312, 409, 415 1-bit D/A converter
310, 410, 414 subtractor
311 adder
313, 413 second power source
320 inverting amplifier
321 PMOS transistor
322 NMOS transistor
351-355, 451-455 block
361, 364, 365, 370-372, 461, 464, 465, 470-472, 561, 564, 570-572 lines in graph
503 offset circuit
504 correction code generation circuit
505, 506 DFF circuit
507 XNOR circuit
508 AND circuit
509 fifth power source
600 camera
610 mobile information terminal device

The invention claimed is:

1. An analog-to-digital (A/D) converter comprising:
an A/D converter circuit that causes a first current which is a dissipation current having dependence on an input voltage; and
a counteracting current generation circuit that generates a second current which is a dissipation current for reducing the dependence of the first current on the input voltage, the counteracting current generation circuit being controlled based on an output digital value outputted from the A/D converter circuit according to the input voltage.

2. The A/D converter according to claim 1,
wherein the counteracting current generation circuit generates the second current to cause a current obtained by adding the first current and the second current together to be substantially invariant to a value of the input voltage.

3. The A/D converter according to claim 1,
wherein if the first current is larger as the input voltage is higher, the counteracting current generation circuit generates the second current to be smaller as the input voltage is higher.

4. The A/D converter according to claim 1,
wherein the A/D converter circuit is a delta sigma analog-to-digital (ΔΣAD) converter circuit.

5. The A/D converter according to claim 4,
wherein the A/D converter circuit includes:
a subtractor that subtracts a reference voltage from the input voltage to output a first signal;
a first integrator that integrates the first signal to output a second signal;
a second integrator that integrates the second signal to output a third signal;
an adder that adds the input voltage, the second signal, and the third signal together to output a fourth signal;
a comparator that compares the fourth signal to a predetermined threshold to output the output digital value; and
a 1-bit digital-to-analog (D/A) converter that generates the reference voltage according to the output digital value.

6. The A/D converter according to claim 4,
wherein the A/D converter circuit includes:
a first subtractor that subtracts a first reference voltage from the input voltage to output a first signal;
a first integrator that integrates the first signal to output a second signal;
a second subtractor that subtracts a second reference voltage from the second signal to output a third signal;
a second integrator that integrates the third signal to output a fourth signal;
a comparator that compares the fourth signal to a predetermined threshold to output the output digital value;
a first 1-bit D/A converter that generates the first reference voltage according to the output digital value; and
a second 1-bit D/A converter that generates the second reference voltage according to the output digital value.

7. The A/D converter according to claim 4,
wherein the first current is a dissipation current that flows into a first power source, and
the counteracting current generation circuit includes:
an inverting circuit that inverts the output digital value to be outputted;

a capacitor having one end connected to a second power source;
a first switch that controls electrical connection between an output terminal of the inverting circuit and an other end of the capacitor according to a first clock signal; and
a second switch that controls electrical connection between the other end of the capacitor and the first power source according to a second clock signal,
wherein the second clock signal is low when the first clock signal is high, and the second clock signal is high when the first clock signal is low, and
if the first switch electrically connects the output terminal of the inverting circuit to the other end of the capacitor when the first clock signal is high, the second switch electrically connects the other end of the capacitor to the first power source when the second clock signal is high.

8. The A/D converter according to claim 4,
wherein the first current is a dissipation current that flows into a first power source, and
the counteracting current generation circuit includes:
a correction code generation circuit that generates a correction code from the output digital value;
a capacitor having one end connected to a second power source;
a first switch that controls electrical connection between an output terminal of the correction code generation circuit and an other end of the capacitor according to a first clock signal; and
a second switch that controls electrical connection between the other end of the capacitor and the first power source according to a second clock signal,
wherein the second clock signal is low when the first clock signal is high, and the second clock signal is high when the first clock signal is low,
if the first switch electrically connects the output terminal of the correction code generation circuit to the other end of the capacitor when the first clock signal is high, the second switch electrically connects the other end of the capacitor to the first power source when the second clock signal is high, and
the correction code varies according to a clock cycle of one of the first clock signal and the second clock signal in a period in which the output digital value does not vary according to the clock cycle.

9. An image sensor comprising
the A/D converter according to claim 1.

10. A digital camera comprising
the image sensor according to claim 9.

11. The A/D converter according to claim 2,
wherein the A/D converter circuit is a delta sigma analog-to-digital ($\Delta\Sigma AD$) converter circuit.

12. The A/D converter according to claim 11,
wherein the A/D converter circuit includes:
a subtractor that subtracts a reference voltage from the input voltage to output a first signal;
a first integrator that integrates the first signal to output a second signal;
a second integrator that integrates the second signal to output a third signal;
an adder that adds the input voltage, the second signal, and the third signal together to output a fourth signal;
a comparator that compares the fourth signal to a predetermined threshold to output the output digital value; and
a 1-bit digital-to-analog (D/A) converter that generates the reference voltage according to the output digital value.

13. The A/D converter according to claim 11,
wherein the A/D converter circuit includes:
a first subtractor that subtracts a first reference voltage from the input voltage to output a first signal;
a first integrator that integrates the first signal to output a second signal;
a second subtractor that subtracts a second reference voltage from the second signal to output a third signal;
a second integrator that integrates the third signal to output a fourth signal;
a comparator that compares the fourth signal to a predetermined threshold to output the output digital value;
a first 1-bit D/A converter that generates the first reference voltage according to the output digital value; and
a second 1-bit D/A converter that generates the second reference voltage according to the output digital value.

14. The A/D converter according to claim 11,
wherein the first current is a dissipation current that flows into a first power source, and
the counteracting current generation circuit includes:
an inverting circuit that inverts the output digital value to be outputted;
a capacitor having one end connected to a second power source;
a first switch that controls electrical connection between an output terminal of the inverting circuit and an other end of the capacitor according to a first clock signal; and
a second switch that controls electrical connection between the other end of the capacitor and the first power source according to a second clock signal,
wherein the second clock signal is low when the first clock signal is high, and the second clock signal is high when the first clock signal is low, and
if the first switch electrically connects the output terminal of the inverting circuit to the other end of the capacitor when the first clock signal is high, the second switch electrically connects the other end of the capacitor to the first power source when the second clock signal is high.

15. The A/D converter according to claim 11,
wherein the first current is a dissipation current that flows into a first power source, and
the counteracting current generation circuit includes:
a correction code generation circuit that generates a correction code from the output digital value;
a capacitor having one end connected to a second power source;
a first switch that controls electrical connection between an output terminal of the correction code generation circuit and an other end of the capacitor according to a first clock signal; and
a second switch that controls electrical connection between the other end of the capacitor and the first power source according to a second clock signal,
wherein the second clock signal is low when the first clock signal is high, and the second clock signal is high when the first clock signal is low,
if the first switch electrically connects the output terminal of the correction code generation circuit to the other end of the capacitor when the first clock signal is high, the second switch electrically connects the other end of the capacitor to the first power source when the second clock signal is high, and
the correction code varies according to a clock cycle of one of the first clock signal and the second clock signal in a period in which the output digital value does not vary according to the clock cycle.

16. The A/D converter according to claim 3,
wherein the A/D converter circuit is a delta sigma analog-to-digital ($\Delta\Sigma AD$) converter circuit.

17. The A/D converter according to claim 16,
wherein the A/D converter circuit includes:
a subtractor that subtracts a reference voltage from the input voltage to output a first signal;
a first integrator that integrates the first signal to output a second signal;
a second integrator that integrates the second signal to output a third signal;
an adder that adds the input voltage, the second signal, and the third signal together to output a fourth signal;
a comparator that compares the fourth signal to a predetermined threshold to output the output digital value; and
a 1-bit digital-to-analog (D/A) converter that generates the reference voltage according to the output digital value.

18. The A/D converter according to claim 16,
wherein the A/D converter circuit includes:
a first subtractor that subtracts a first reference voltage from the input voltage to output a first signal;
a first integrator that integrates the first signal to output a second signal;
a second subtractor that subtracts a second reference voltage from the second signal to output a third signal;
a second integrator that integrates the third signal to output a fourth signal;
a comparator that compares the fourth signal to a predetermined threshold to output the output digital value;
a first 1-bit D/A converter that generates the first reference voltage according to the output digital value; and
a second 1-bit D/A converter that generates the second reference voltage according to the output digital value.

19. The A/D converter according to claim 16,
wherein the first current is a dissipation current that flows into a first power source, and
the counteracting current generation circuit includes:
an inverting circuit that inverts the output digital value to be outputted;
a capacitor having one end connected to a second power source;
a first switch that controls electrical connection between an output terminal of the inverting circuit and an other end of the capacitor according to a first clock signal; and
a second switch that controls electrical connection between the other end of the capacitor and the first power source according to a second clock signal,
wherein the second clock signal is low when the first clock signal is high, and the second clock signal is high when the first clock signal is low, and
if the first switch electrically connects the output terminal of the inverting circuit to the other end of the capacitor when the first clock signal is high, the second switch electrically connects the other end of the capacitor to the first power source when the second clock signal is high.

20. The A/D converter according to claim 16,
wherein the first current is a dissipation current that flows into a first power source, and
the counteracting current generation circuit includes:
a correction code generation circuit that generates a correction code from the output digital value;
a capacitor having one end connected to a second power source;
a first switch that controls electrical connection between an output terminal of the correction code generation circuit and an other end of the capacitor according to a first clock signal; and
a second switch that controls electrical connection between the other end of the capacitor and the first power source according to a second clock signal,
wherein the second clock signal is low when the first clock signal is high, and the second clock signal is high when the first clock signal is low,
if the first switch electrically connects the output terminal of the correction code generation circuit to the other end of the capacitor when the first clock signal is high, the second switch electrically connects the other end of the capacitor to the first power source when the second clock signal is high, and
the correction code varies according to a clock cycle of one of the first clock signal and the second clock signal in a period in which the output digital value does not vary according to the clock cycle.

* * * * *